(12) United States Patent
Yamazaki

(10) Patent No.: US 8,802,462 B2
(45) Date of Patent: Aug. 12, 2014

(54) DISPLAY DEVICE AND METHOD FOR MANUFACTURING THE SAME

(71) Applicant: Semiconductor Engergy Laboratory Co., Ltd., Atsugi (JP)

(72) Inventor: Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 13/683,136

(22) Filed: Nov. 21, 2012

(65) Prior Publication Data
US 2013/0084665 A1 Apr. 4, 2013

Related U.S. Application Data

(62) Division of application No. 12/324,089, filed on Nov. 26, 2008, now abandoned.

(30) Foreign Application Priority Data

Dec. 3, 2007 (JP) ................................. 2007-312533

(51) Int. Cl.
*H01L 21/00* (2006.01)
*H01L 21/30* (2006.01)
*H01L 21/46* (2006.01)

(52) U.S. Cl.
USPC ...................... 438/26; 438/458; 257/E21.568

(58) Field of Classification Search
CPC .................. H01L 21/76243; H01L 21/76254; H01L 21/76256; H01L 27/1203; H01L 27/1214; H01L 27/1266; H01L 29/045; H01L 29/66772; H01L 29/78603; H01L 31/02021; H01L 31/022425; H01L 31/028; H01L 31/0296; H01L 31/0304; H01L 31/03529

USPC ......................... 438/26–35, 64–69, 455, 458; 257/E21.568, E21.57

See application file for complete search history.

(56) References Cited

U.S. PATENT DOCUMENTS 5,374,564 A 12/1994 Bruel
6,157,421 A 12/2000 Ishii
(Continued)

FOREIGN PATENT DOCUMENTS

CN 1312483 9/2001
EP 1 154 383 11/2001
(Continued)

OTHER PUBLICATIONS

European Search Report (Application No. 05020906.7; EP11105) Dated Feb. 5, 2013.
(Continued)

*Primary Examiner* — Calvin Choi
(74) *Attorney, Agent, or Firm* — Nixon Peabody LLP; Jeffrey L. Costellia

(57) ABSTRACT

To provide an input device including a display screen which has an image display function and a text information input function by using a display portion in which a pixel includes an optical sensor. An optical sensor is provided in each pixel of the display portion in order to detect position information. A transistor of a pixel circuit in the display portion and the optical sensor are formed using a single crystal semiconductor layer. By using the single crystal semiconductor layer, there is no variation in characteristics among pixels, and position detection with high accuracy is realized. Moreover, the display portion is formed using a substrate which is a light-transmitting substrate such as a glass substrate provided with a single crystal semiconductor layer separated from a single crystal semiconductor substrate.

10 Claims, 22 Drawing Sheets

(56) References Cited

U.S. PATENT DOCUMENTS

| | | | |
|---|---|---|---|
| 6,236,063 B1 | 5/2001 | Yamazaki et al. | |
| 6,384,818 B1 | 5/2002 | Yamazaki et al. | |
| 6,583,439 B2 | 6/2003 | Yamazaki et al. | |
| 6,747,290 B2 | 6/2004 | Yamazaki et al. | |
| 6,747,638 B2 | 6/2004 | Yamazaki et al. | |
| 6,852,653 B2 | 2/2005 | Yamazaki et al. | |
| 6,927,148 B2 * | 8/2005 | Ito | 438/458 |
| 7,030,551 B2 | 4/2006 | Yamazaki et al. | |
| 7,068,254 B2 | 6/2006 | Yamazaki et al. | |
| 7,148,124 B1 * | 12/2006 | Usenko | 438/458 |
| 7,165,729 B2 | 1/2007 | Bradley et al. | |
| RE39,484 E | 2/2007 | Bruel | |
| 7,180,092 B2 | 2/2007 | Yamazaki et al. | |
| 7,229,862 B2 | 6/2007 | Yamazaki et al. | |
| 7,365,750 B2 | 4/2008 | Yamazaki et al. | |
| 7,572,688 B2 | 8/2009 | Yamazaki et al. | |
| 7,608,521 B2 * | 10/2009 | Cites et al. | 438/455 |
| 7,662,704 B2 | 2/2010 | Yasukawa | |
| 7,859,187 B2 | 12/2010 | Yamazaki et al. | |
| 7,866,560 B2 | 1/2011 | Woodhouse et al. | |
| 7,965,266 B2 | 6/2011 | Yamaguchi et al. | |
| 8,004,484 B2 | 8/2011 | Tateuchi et al. | |
| 8,184,090 B2 | 5/2012 | Sato et al. | |
| 2002/0052192 A1 | 5/2002 | Yamazaki et al. | |
| 2003/0116802 A1 | 6/2003 | Yamazaki et al. | |
| 2003/0156100 A1 | 8/2003 | Gettemy | |
| 2005/0014319 A1 | 1/2005 | Yamazaki et al. | |
| 2006/0033016 A1 | 2/2006 | Ogawa et al. | |
| 2006/0033729 A1 | 2/2006 | Yoshida et al. | |
| 2006/0197753 A1 | 9/2006 | Hotelling | |
| 2006/0232546 A1 * | 10/2006 | Yamazaki et al. | 345/104 |
| 2006/0244693 A1 | 11/2006 | Yamaguchi et al. | |
| 2006/0256093 A1 | 11/2006 | Furukawa et al. | |
| 2007/0070056 A1 | 3/2007 | Sato et al. | |
| 2007/0109260 A1 | 5/2007 | Moon et al. | |
| 2007/0212828 A1 | 9/2007 | Yamazaki et al. | |
| 2007/0281440 A1 | 12/2007 | Cites et al. | |
| 2008/0070335 A1 * | 3/2008 | Yamazaki et al. | 438/34 |
| 2008/0094426 A1 | 4/2008 | Kimpe | |
| 2008/0122796 A1 | 5/2008 | Jobs et al. | |
| 2009/0033638 A1 | 2/2009 | Yamaguchi et al. | |
| 2009/0038669 A1 * | 2/2009 | Atanackovic | 136/244 |
| 2010/0233866 A1 * | 9/2010 | Akiyama et al. | 438/455 |
| 2012/0249483 A1 | 10/2012 | Sato et al. | |

FOREIGN PATENT DOCUMENTS

| | | |
|---|---|---|
| JP | 05-211128 | 8/1993 |
| JP | 08-160466 | 6/1996 |
| JP | 11-326954 | 11/1999 |
| JP | 2002-033823 | 1/2002 |
| JP | 2002-124652 | 4/2002 |
| JP | 2002-287900 | 10/2002 |
| JP | 2005-150685 | 6/2005 |
| JP | 2006-039272 | 2/2006 |
| JP | 2006-079586 | 3/2006 |
| JP | 2006-079589 | 3/2006 |
| JP | 2006-301864 | 11/2006 |
| JP | 2006-317682 | 11/2006 |
| JP | 2006-349890 | 12/2006 |
| JP | 2007-094606 | 4/2007 |
| JP | 2007-102054 | 4/2007 |
| JP | 2007-299012 | 11/2007 |
| JP | 2008-096553 | 4/2008 |
| TW | 200529445 | 9/2005 |
| WO | WO-2005/048221 | 5/2005 |

OTHER PUBLICATIONS

Chinese Office Action (Application No. 200810179743.4), Dated: Aug. 24, 2011.

Chinese Office Action (Application No. 20081017943.4), Dated: Aug. 24, 2011.

Taiwanese Office Action (Application No. 97146667; TW11105) Dated Dec. 9, 2013.

* cited by examiner

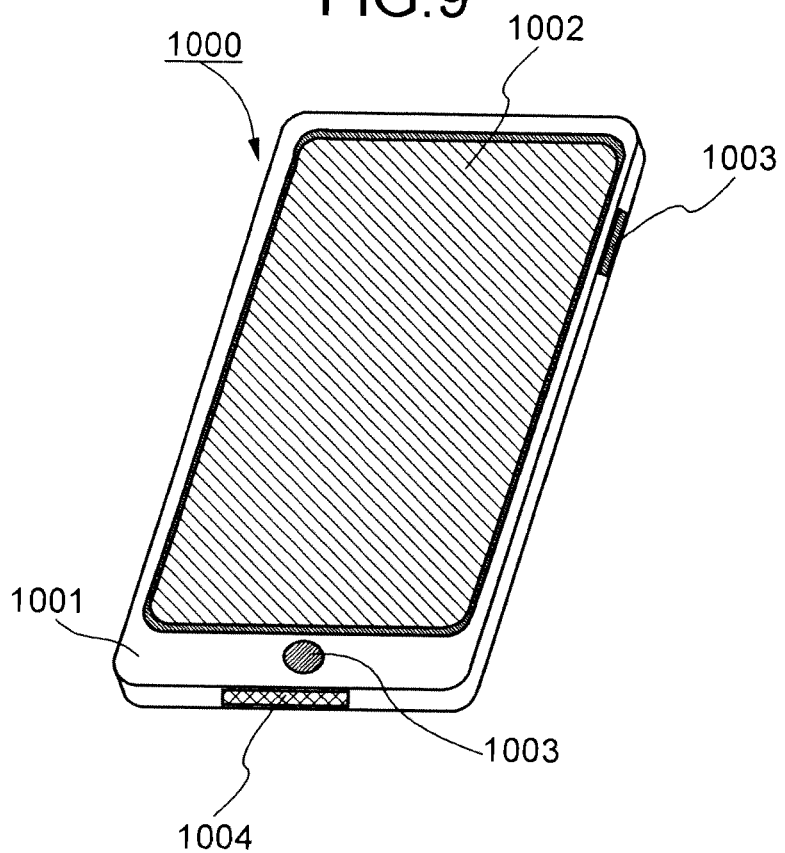

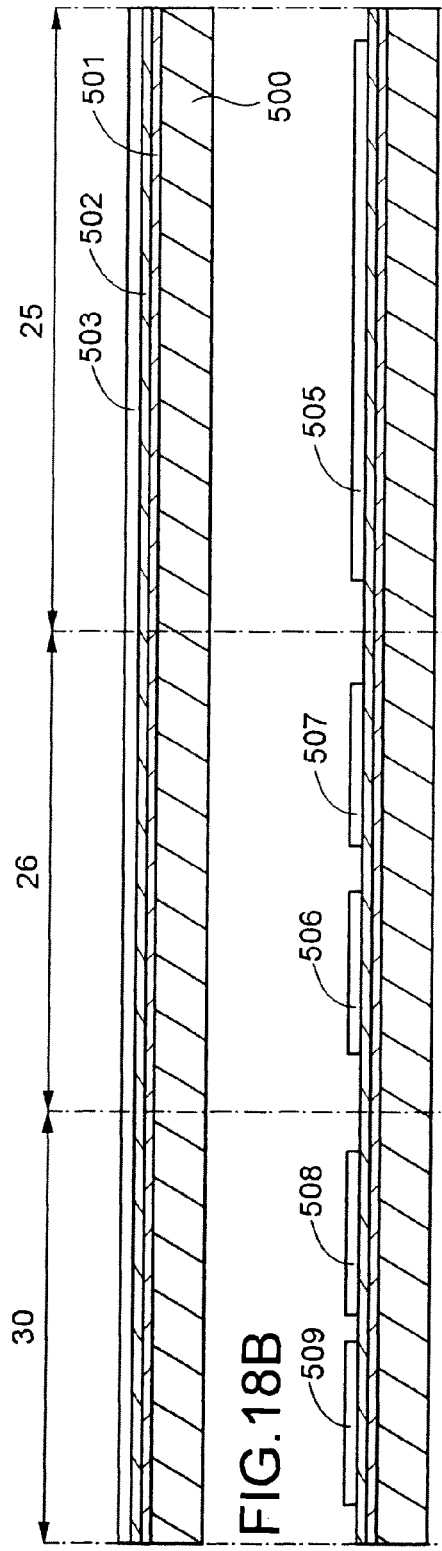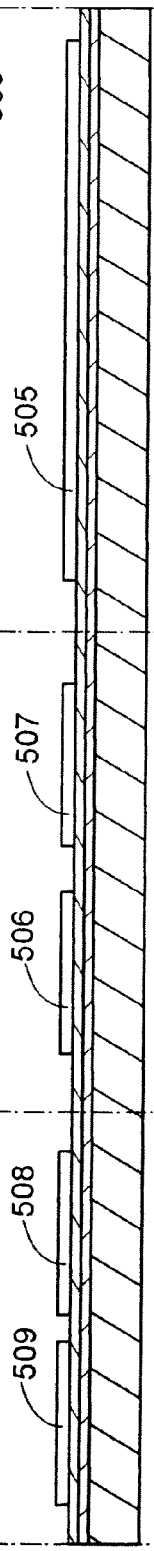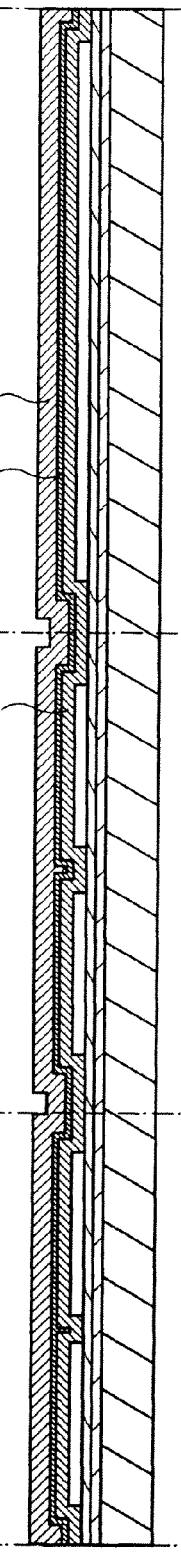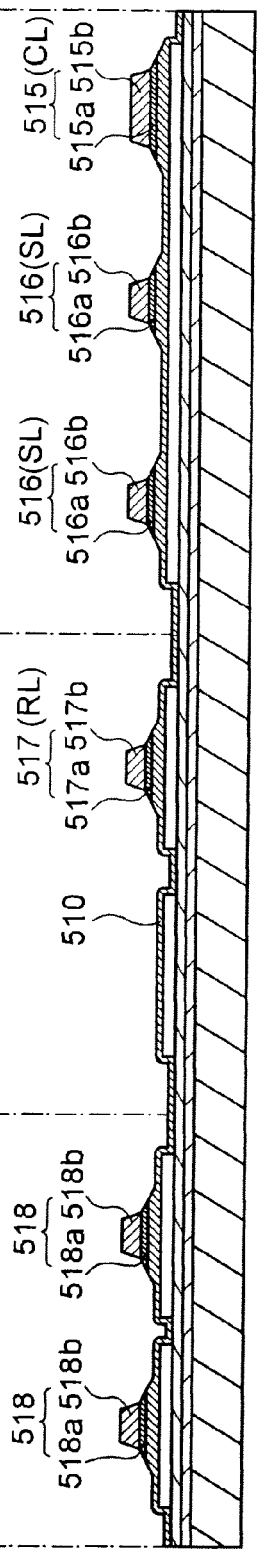

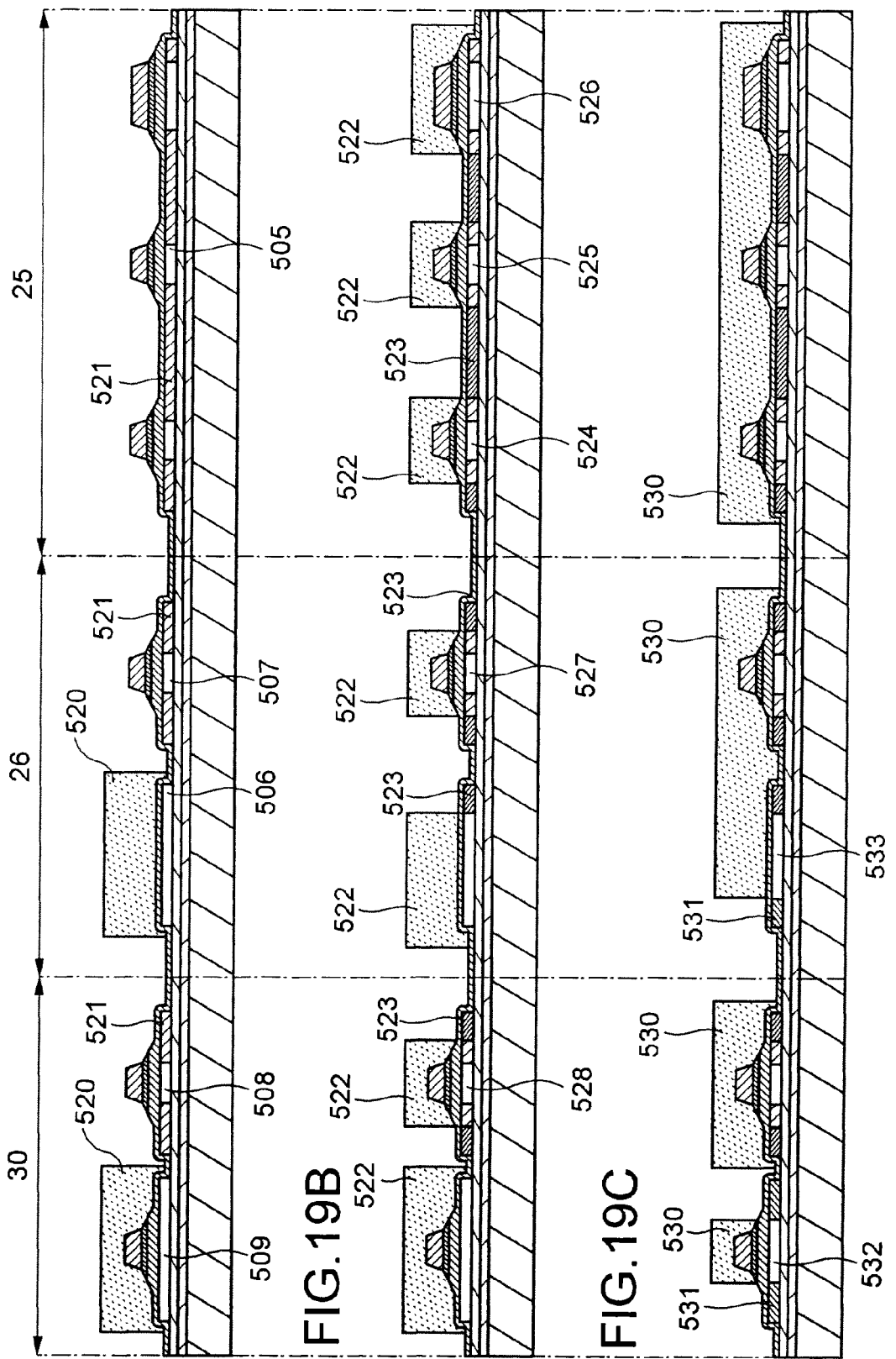

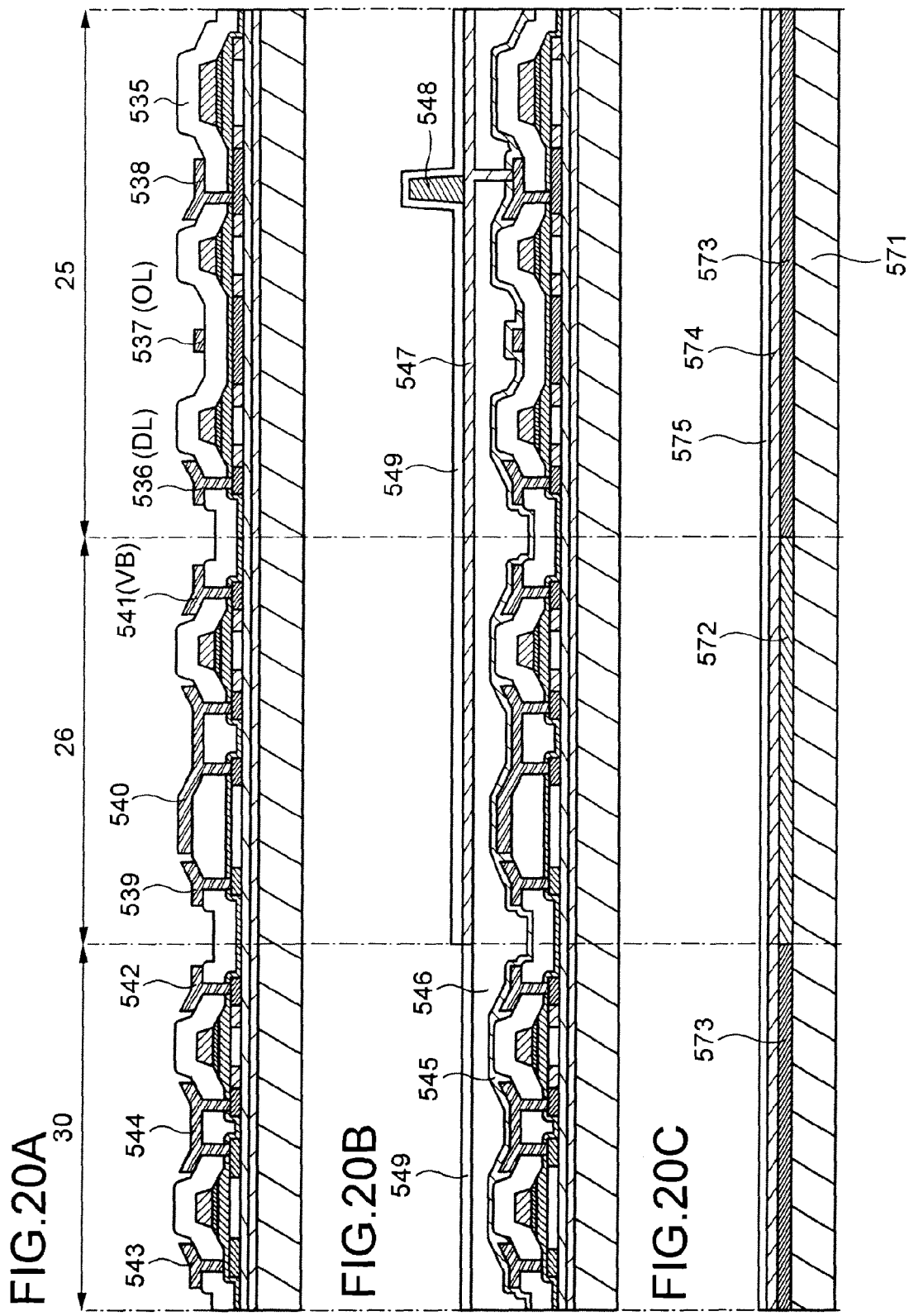

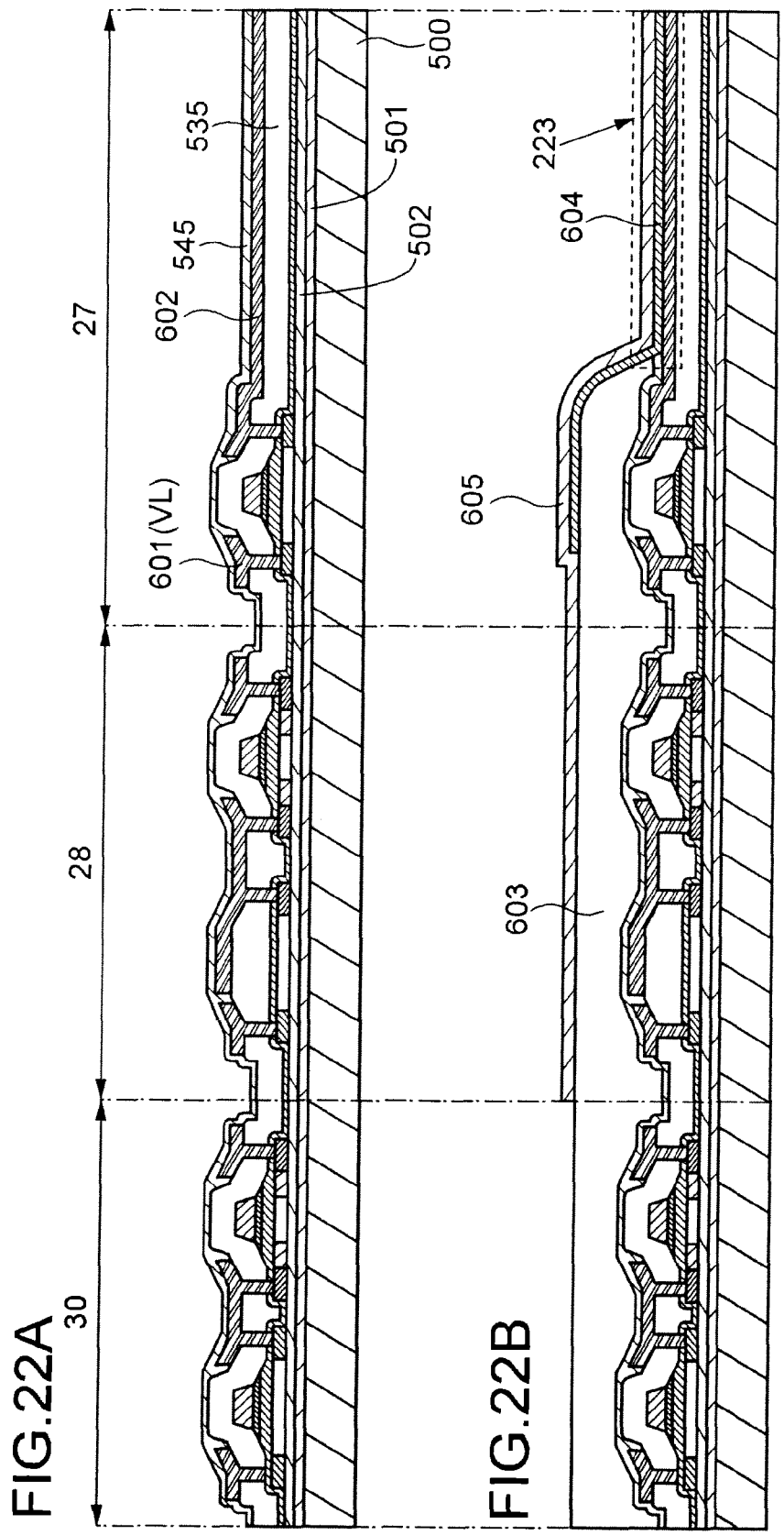

DISPLAY DEVICE AND METHOD FOR MANUFACTURING THE SAME

BACKGROUND OF THE INVENTION

1. Field of the Invention

The present invention relates to a display device (hereinafter, also referred to as an input device) provided with a display portion having an input function and a method for manufacturing the input device.

2. Description of the Related Art

Display panels to which text information can be input by touching a screen with a finger or a stylus pen have spread and have been used for a portable information terminal such as a PDA (personal digital assistant or personal data assistance), a potable game machine, a car navigation system, and an automated teller machine (ATM), for example.

As such a display panel, a display panel having a screen provided with an optical sensor is known (see Patent Documents 1 to 3). The amount of light received by an optical sensor is changed when a screen is touched with a finger or the like. Accordingly, by detecting the change, the position of the screen touched with the finger can be detected.

In Patent Document 1 (Japanese Published Patent Application No. 2002-287900), a pixel functioning as a display portion and an input portion is provided with an EL element and a photoelectric conversion element. By reflecting light by the point of a pen used for input, accurate information input can be realized.

In Patent Document 2 (Japanese Published Patent Application No. 2006-317682), by controlling on and off of a backlight at the time of image display and optical sensor output, detection accuracy of the optical sensor is improved.

In Patent Document 3 (Japanese Published Patent Application No. 2002-33823), an optical sensor is provided in a pixel of a liquid crystal display device so that an image sensor is incorporated in a screen of the display device, whereby a personal authentication system is constructed.

SUMMARY OF THE INVENTION

One of objects of the present invention is to provide an input device which is provided with a display portion including a pixel with an optical sensor and having a display function and an input function, which enables position detection by the optical sensor to be performed accurately.

Another object of the present invention is to provide a method for manufacturing an input device which is provided with a display portion including a pixel with an optical sensor and having a display function and an input function, which enables position detection by the optical sensor to be performed accurately.

One aspect of the present invention is an input device including a display portion including a plurality of pixels; a pixel circuit provided in each of the plurality of pixels and including a liquid crystal element and a transistor; a sensor circuit provided in all or part of the plurality of pixels and including an optical sensor and a transistor; a pixel driver circuit electrically connected to the pixel circuit; a sensor driver circuit electrically connected to the sensor driver circuit; and a display switching circuit electrically connected to the sensor driver circuit and the pixel driver circuit. A detection signal of the optical sensor is input to the sensor driver circuit and the sensor driver circuit outputs the detection signal to the display switching circuit. The display switching circuit outputs a signal for switching display of the display portion to the pixel driver circuit, based on the detection signal input from the sensor driver circuit. The pixel circuit, the sensor circuit, the pixel driver circuit, and the sensor driver circuit are formed over the same substrate. Semiconductor layers of the transistors in the pixel circuit and the sensor circuit and semiconductor layers of transistors in the pixel driver circuit and the sensor driver circuit are formed using a single crystal semiconductor layer. A photoelectric conversion layer of the optical sensor is formed using a single crystal semiconductor layer.

The input device according to the present invention may include a backlight unit including a plurality of light-emitting diodes and illuminating the display portion.

In the input device according to the present invention, instead of the liquid crystal element, a light-emitting element may be provided in the pixel circuit.

Another aspect of the present invention is a method for manufacturing an input device including a display portion including a plurality of pixels; a pixel circuit provided in each of the plurality of pixels and including a liquid crystal element and a transistor; a sensor circuit provided in all or part of the plurality of pixels and including an optical sensor and a transistor; a pixel driver circuit electrically connected to the pixel circuit; and a sensor driver circuit electrically connected to the sensor circuit. In the manufacturing method of the present invention, a single crystal semiconductor substrate and a supporting substrate is prepared. A damaged region is formed in a region at a predetermined depth from a surface of the single crystal semiconductor substrate by adding an accelerated ion to the single crystal semiconductor substrate. A buffer layer is formed over at least one of the supporting substrate and the single crystal semiconductor substrate. The single crystal semiconductor substrate is fixed to the supporting substrate by disposing the supporting substrate and the single crystal semiconductor substrate in contact with each other with the buffer layer therebetween so that a surface of the buffer layer and a surface disposed in contact with the surface of the buffer layer are bonded to each other. The supporting substrate to which a single crystal semiconductor layer separated from the single crystal semiconductor substrate is fixed is formed by generating a crack in the damaged region by heating of the single crystal semiconductor substrate so that the single crystal semiconductor substrate is separated from the supporting substrate. A plurality of single crystal semiconductor layers are formed by dividing the single crystal semiconductor layer among elements. The transistors in the pixel circuit and the sensor circuit, transistors in the pixel driver circuit and the sensor driver circuit, and the optical sensor are formed using the divided single crystal semiconductor layer.

In the manufacturing method of the present invention, instead of the liquid crystal element, a light-emitting element may be provided in the pixel circuit.

Since a transistor and an optical sensor in an input device of the present invention are formed using a single crystal semiconductor layer, there is little variation in characteristics among pixels and among elements. Accordingly, position detection by the optical sensor can be performed accurately.

Since in the method for manufacturing an input device of the present invention, a transistor and an optical sensor are formed using a single crystal semiconductor layer made of a single crystal semiconductor substrate, there is little variation in characteristics among pixels and among elements. Accordingly, the input device which is capable of accurately performing position detection by the optical sensor can be formed.

BRIEF DESCRIPTION OF THE DRAWINGS

In the accompanying drawings:

FIG. 9 is an external view of a PDA;

FIGS. 15A-1 to 15A-3 and 15B to 15D are cross-sectional views illustrating a method for manufacturing a semiconductor substrate;

FIGS. 18A to 18D are cross-sectional views illustrating a method for manufacturing an input device;

FIGS. 19A to 19C are cross-sectional views illustrating a method for manufacturing an input device;

FIGS. 20A to 20C are cross-sectional views illustrating a method for manufacturing an input device;

FIGS. 22A and 22B are cross-sectional views illustrating a method for manufacturing an input device.

DETAILED DESCRIPTION OF THE INVENTION

Figure 1:
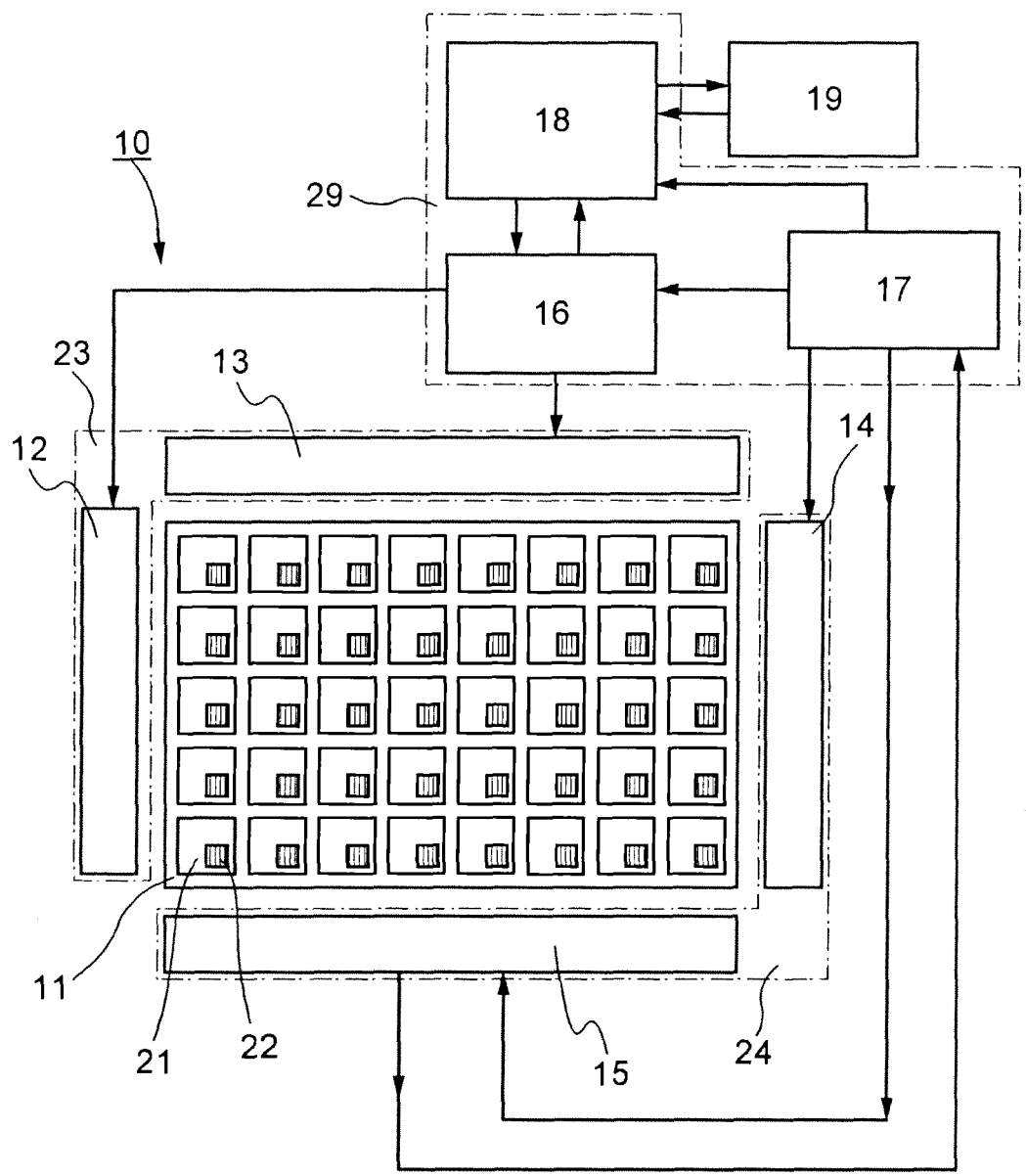
FIG. 1 is a block diagram illustrating a structural example of an input device.

The present invention will be hereinafter described. The present invention can be implemented in various modes, and it is easily understood by those skilled in the art that modes and details can be variously changed without departing from the spirit and the scope of the present invention. Therefore, the present invention is not construed as being limited to the description of the embodiment modes. Note that the same components are denoted by the same reference numerals in different drawings, and description of materials, shapes, manufacturing methods, and the like is not repeated.

Embodiment Mode 1

In this embodiment mode, an input device of the present invention, which includes a display portion having a display function and an input function, is described.

First, a structure of an input device according to the present invention is described. FIG. 1 is a block diagram illustrating one structural example of the input device. An input device 10 includes a display portion 11, and a scan line driver circuit 12 and a data line driver circuit 13 which are electrically connected to the display portion 11. Moreover, the input device 10 includes a display control circuit 16 for controlling the scan line driver circuit 12 and the data line driver circuit 13, a sensor control circuit 17 for controlling a scan line driver circuit 14 for sensors and a data line driver circuit 15 for sensors, an arithmetic circuit 18 for controlling the display control circuit 16 and the sensor control circuit 17, and a memory circuit 19 for storing various kinds of data.

The arithmetic circuit 18 controls the circuits included in the input device 10, performs a variety of arithmetic processing and the like, and includes a CPU (central processing unit), an arithmetic circuit for image processing, and the like.

The memory circuit 19 stores data and includes a ROM in which a computer program, a filter for image processing, a lookup table, and the like used by the arithmetic circuit 18 are stored; a RAM in which an arithmetic result calculated by the arithmetic circuit 18, image data, and the like are stored; and the like.

The display portion 11 includes a plurality of pixels 21. Each pixel 21 is provided with a pixel circuit including a display element and a transistor; and a sensor circuit including an optical sensor 22 and a transistor.

The pixel circuit is connected to the scan line driver circuit 12 through a scan line and connected to the data line driver circuit 13 through a data line. Examples of the display element include an element which changes a polarization state of light passing therethrough, such as a liquid crystal element, and a light-emitting element such as an EL (electroluminescence) element. By the pixel circuit, alignment of liquid crystal molecules of the liquid crystal element is controlled, a polarization state of light passing through the liquid crystal element is controlled, and the pixel 21 emits light with desired luminance. Alternatively, brightness of the light-emitting element is controlled by the pixel circuit, and the pixel 21 emits light with desired luminance. In such a manner, the scan line driver circuit 12 and the data line driver circuit 13 form a pixel driver circuit 23 which drives the pixel circuit.

The sensor circuit is connected to the scan line driver circuit 14 for sensors through a scan line for sensors and connected to the data line driver circuit 15 for sensors through a data line for sensors. The optical sensor 22 is an element for converting received light into an electric signal, and a photodiode is used, for example. A signal detected by the optical sensor 22 is output to the data line driver circuit 15 for sensors from each pixel 21 in a row specified by a sensor selection signal output from the scan line driver circuit 14 for sensors. In such a manner, the scan line driver circuit 14 for sensors and the data line driver circuit 15 for sensors form a sensor driver circuit 24 which drives the sensor circuit.

The display control circuit 16 controls the pixel driver circuit 23 (the scan line driver circuit 12 and the data line driver circuit 13). In accordance with a signal input from the display control circuit 16, the scan line driver circuit 12 outputs a signal to the scan line and the data line driver circuit 13 outputs image data to the data line. In the display portion 11, an image is displayed in accordance with the signals input to the scan line and the data line. For example, the display control circuit 16 includes an AD converter (an analog-digital conversion circuit) which converts analog image data into digital data, a DA converter (a digital-analog conversion circuit) which converts digital image data into analog data, an image processing circuit which performs image processing such as gamma correction, and the like.

The sensor control circuit 17 controls the sensor driver circuit 24 (the scan line driver circuit 14 for sensors and the data line driver circuit 15 for sensors). In accordance with a signal input from the sensor control circuit 17, the scan line driver circuit 14 for sensors outputs a signal to the scan line for sensors. From the data line driver circuit 15 for sensors, the sensor control circuit 17 reads a detection signal input from the display portion 11 to the data line driver circuit 15 for sensors. The detection signal is analyzed in the sensor control circuit 17 or the arithmetic circuit 18, and the position of the optical sensor 22 is detected.

The display control circuit 16, the sensor control circuit 17, and the arithmetic circuit 18 form a display switching circuit 29. The display switching circuit 29 outputs a signal for switching an image displayed in the display portion 11 to the pixel driver circuit 23, based on a detection signal input from the sensor driver circuit 24. That is, based on the position information of the optical sensor 22 detected by the sensor control circuit 17 or the arithmetic circuit 18, the arithmetic circuit 18 determines an image displayed in the display portion 11, controls the display control circuit 16, and changes an image displayed in the display portion 11.

In the input device 10, the transistors in the pixel circuit and the sensor circuit of the display portion 11 and transistors included in the scan line driver circuit 12, the data line driver circuit 13, the scan line driver circuit 14 for sensors, and the data line driver circuit 15 for sensors are formed over the same substrate.

A semiconductor layer in each of these transistors is formed using a single crystal semiconductor layer, and a photoelectric conversion layer is also formed using a single crystal semiconductor layer. Accordingly, variation in characteristics among elements can be remarkably suppressed as compared to an element formed using amorphous silicon or the like, whereby position detection with high accuracy can be performed by the optical sensor 22. Moreover, variation in luminance of each of the pixels 21 can also be suppressed, whereby the input device 10 with high reliability can be provided.

Further, since a single crystal semiconductor layer is used, a transistor with high mobility, through which a large amount of current flows, can be formed. Thus, the size of the transistor can be reduced, whereby the area occupied by the scan line driver circuit 12, the data line driver circuit 13, the scan line driver circuit 14 for sensors, and the data line driver circuit 15 for sensors can be reduced. Accordingly, increase in size of a screen and high definition of the display portion 11 can be realized.

Note that in the input device 10, not only the driver circuits such as the scan line driver circuit 12 but also another circuit can be integrated over the same substrate as the display portion 11. Examples of such a circuit include the entire or part of the display control circuit 16, the entire or part of the sensor control circuit 17, the entire or part of the arithmetic circuit 18, and the entire or part of the memory circuit 19.

Figure 2A:
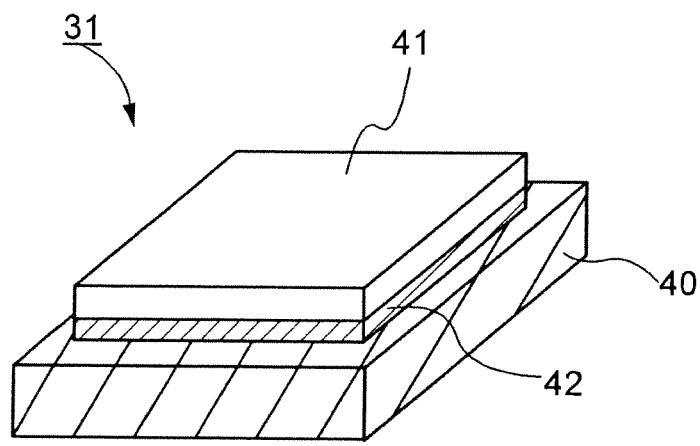
FIGS. 2A to 2C are perspective views each illustrating a structural example of a semiconductor substrate.
Figure 2B:
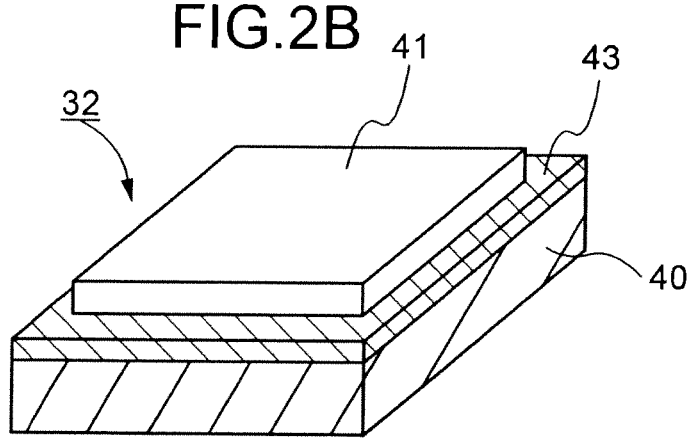
Figure 2C:
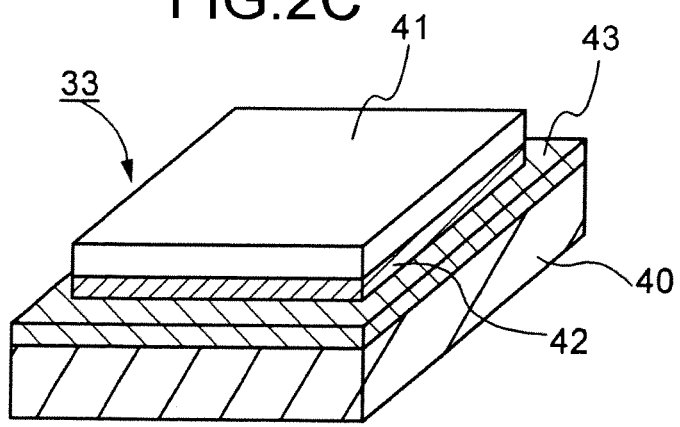

In the input device 10, as a substrate for forming the transistor in the pixel circuit of the display portion 11, the optical sensor 22 in the sensor circuit, and the transistors included in the scan line driver circuit 12, the data line driver circuit 13, the scan line driver circuit 14 for sensors, and the data line driver circuit 15 for sensors, a semiconductor substrate can be used in which a single crystal semiconductor layer is provided over a light-transmitting substrate with an insulating film therebetween. FIGS. 2A to 2C are perspective views each illustrating a structural example of such a semiconductor substrate.

Each of semiconductor substrates 31 to 33 illustrated in FIGS. 2A to 2C is a substrate having an SOI structure, in which a single crystal semiconductor layer is formed over an insulating layer. As illustrated in FIG. 2A, the semiconductor substrate 31 is a substrate in which a single crystal semiconductor layer 41 is fixed to a supporting substrate 40 with a buffer layer 42 therebetween. By bonding a surface of the buffer layer 42 and a surface of the supporting substrate 40 to each other, the single crystal semiconductor layer 41 is fixed to the supporting substrate 40.

As illustrated in FIG. 2B, the semiconductor substrate 32 is a substrate in which the single crystal semiconductor layer 41 is fixed to the supporting substrate 40 with a buffer layer 43 therebetween. By bonding a surface of the buffer layer 43 and a surface of the single crystal semiconductor layer 41 to each other, the single crystal semiconductor layer 41 is fixed to the supporting substrate 40.

As illustrated in FIG. 2C, the semiconductor substrate 33 is a substrate in which the single crystal semiconductor layer 41 is fixed to the supporting substrate 40 with the buffer layers 42 and 43 therebetween. By bonding a surface of the buffer layer 42 and a surface of the single crystal semiconductor layer 41 to each other, the single crystal semiconductor layer 41 is fixed to the supporting substrate 40.

A light-transmitting substrate is used as the supporting substrate 40. Specific examples of the light-transmitting substrate include a variety of glass substrates that are used in the electronics industry, such as a substrate of aluminosilicate glass, aluminoborosilicate glass, or barium borosilicate glass, a quartz substrate, a ceramic substrate, and a sapphire substrate. A glass substrate is preferably used as the supporting substrate 40.

As the glass substrate, it is preferable to use a substrate with a thermal expansion coefficient of equal to or more than $25 \times 10^{-7}/°$ C. and equal to or less than $50 \times 10^{-7}/°$ C. (preferably equal to or more than $30 \times 10^{-7}/°$ C. and equal to or less than $40 \times 10^{-7}/°$ C.) and a strain point of equal to or more than 580° C. and equal to or less than 700° C. Moreover, in order to suppress contamination of a semiconductor element, a non-alkali glass substrate is preferably used as the glass substrate. Examples of a material for the non-alkali glass substrate include glass materials such as aluminosilicate glass, aluminoborosilicate glass, and barium borosilicate glass.

The single crystal semiconductor layer 41 is formed by separation from a single crystal semiconductor substrate. As the single crystal semiconductor substrate, a commercial semiconductor substrate, for example, a single crystal semiconductor substrate formed using an element of Group 14, such as a single crystal silicon substrate, a single crystal germanium substrate, or a single crystal silicon germanium substrate can be used.

Each of the buffer layers 42 and 43 may have a single-layer structure or a stacked-layer structure in which two or more layers are stacked. As an insulating film forming the buffer layers 42 and 43, an insulating film containing silicon or germanium, such as a silicon oxide film, a silicon nitride film, a silicon oxynitride film, a silicon nitride oxide film, a germanium oxide film, a germanium nitride film, a germanium oxynitride film, or a germanium nitride oxide film, can be used. Moreover, an insulating film formed using metal oxide such as aluminum oxide, tantalum oxide, or hafnium oxide; an insulating film formed using metal nitride such as aluminum nitride; an insulating film formed using metal oxynitride, such as an aluminum oxynitride film; or an insulating film formed using metal nitride oxide, such as an aluminum nitride oxide film can also be used.

Figure 3:
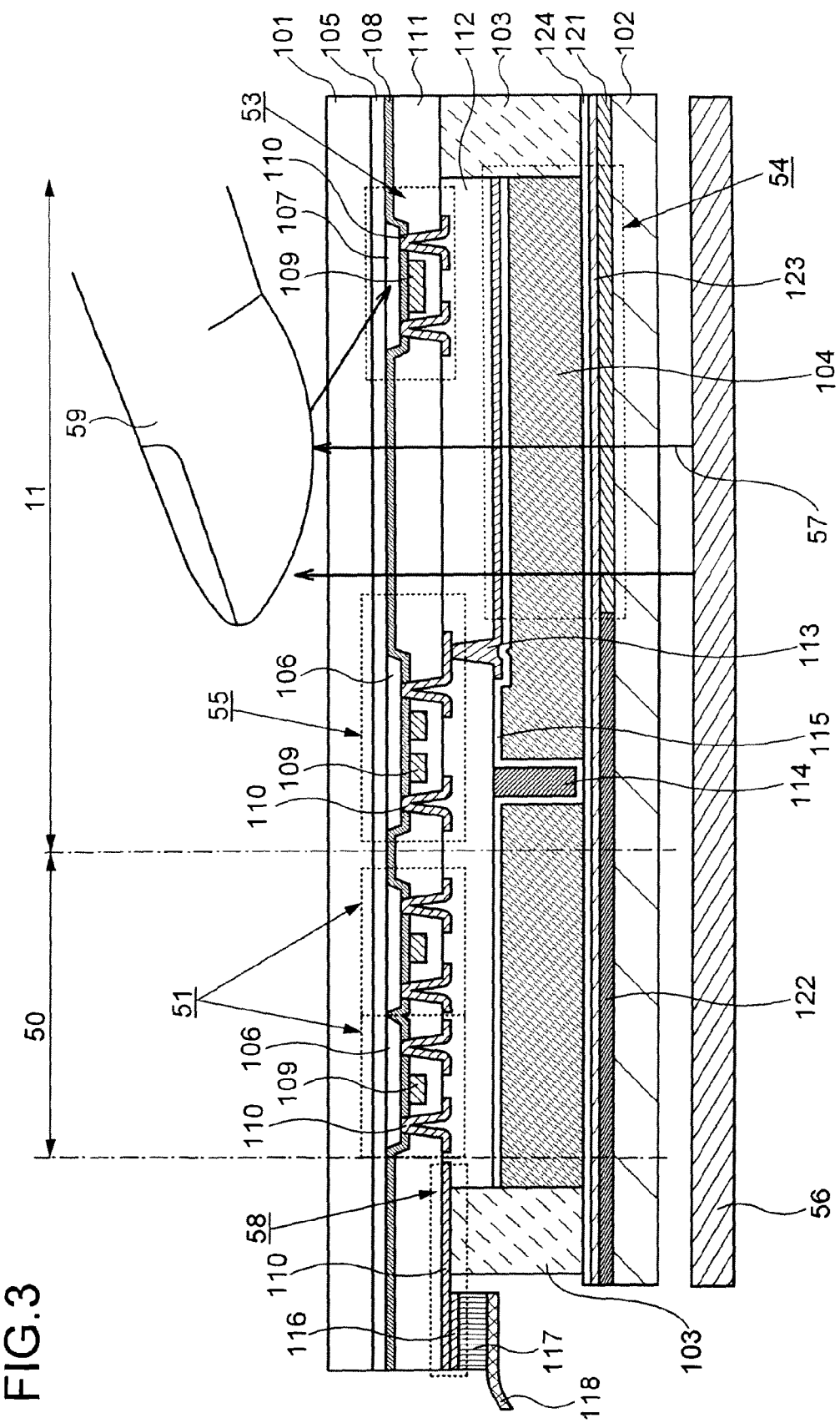
FIG. 3 is a cross-sectional view illustrating a structure of an input device in which a liquid crystal element is formed in a display portion.
Figure 4:
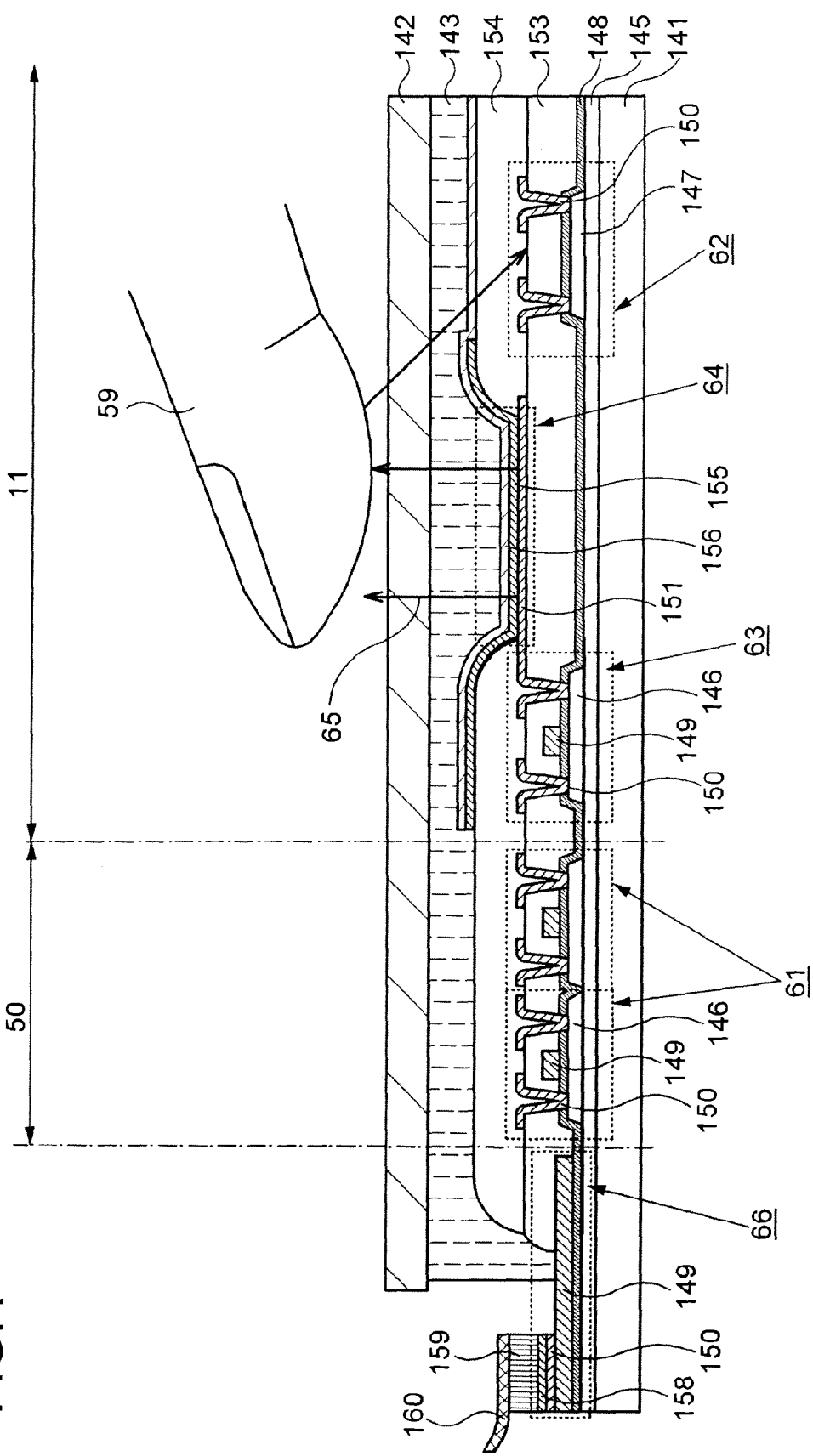
FIG. 4 is a cross-sectional view illustrating a structure of an input device in which a light-emitting element is formed in a display portion.
Figure 5:
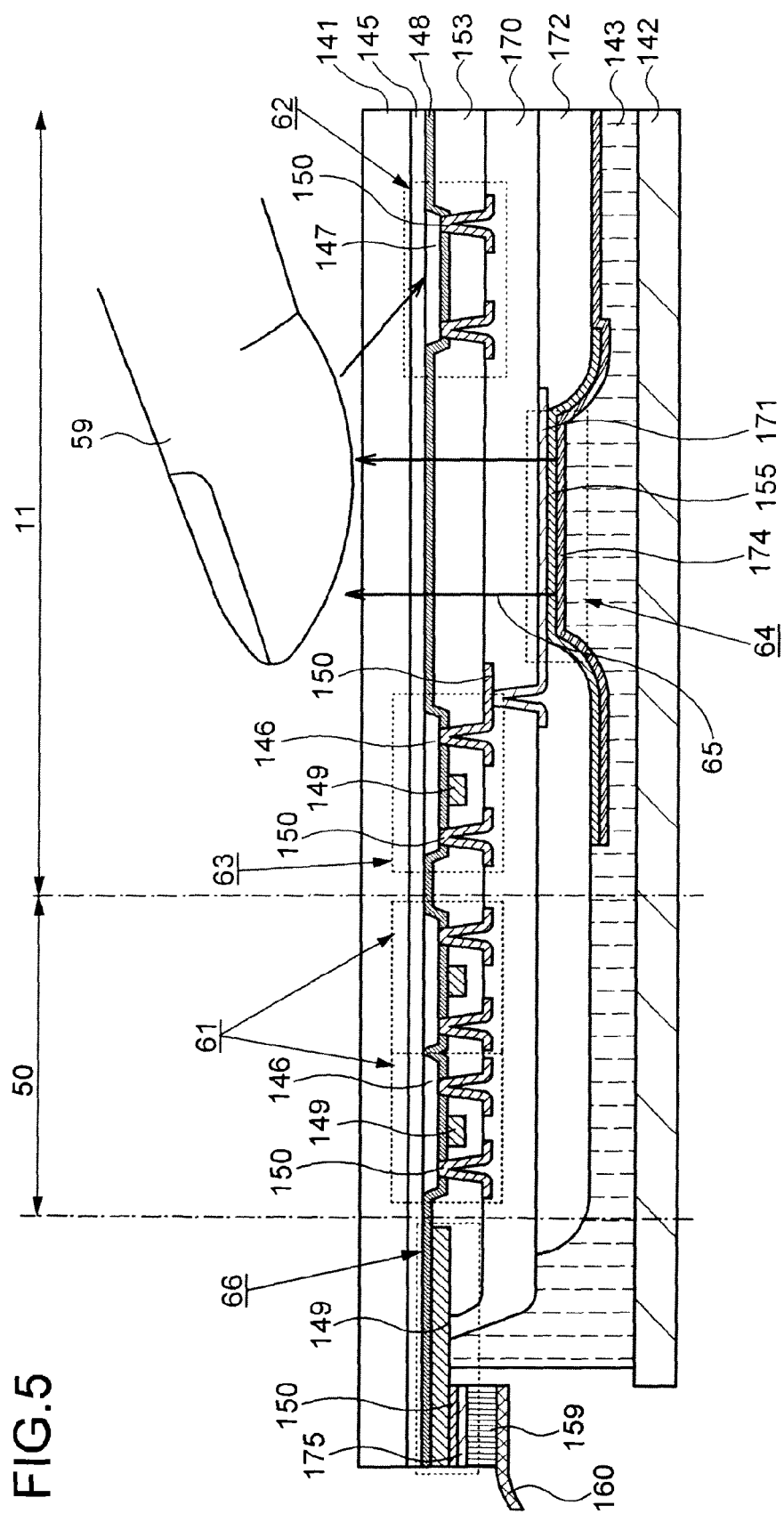
FIG. 5 is a cross-sectional view illustrating a structure of an input device in which a light-emitting element is formed in a display portion.

Next, a structure of the input device 10 is described with reference to FIGS. 3 to 5. FIG. 3 is a cross-sectional view illustrating a structure of the input device 10 in which a liquid crystal element is used as a display element. FIGS. 4 and 5 are each a cross-sectional view illustrating a structure of the input device 10 in which a light-emitting element is used as a display element.

In the input device 10 of FIG. 3, the display portion 11, the pixel driver circuit 23, and the sensor driver circuit 24 form an active matrix liquid crystal panel. A control circuit portion 50 in FIG. 3 represents a group of circuits formed over the same substrate as the display portion 11, such as the pixel driver circuit 23 and the sensor driver circuit 24. FIG. 3 illustrates two transistors 51 as a cross section of the control circuit portion 50. Moreover, FIG. 3 illustrates one pixel 21 as a cross section of the display portion 11 and shows a photodiode 53 included in the optical sensor 22, and a liquid crystal element 54 and a transistor 55 which are included in the pixel circuit. Further, the input device 10 includes a backlight unit 56 for illuminating the display portion 11.

In order to form the liquid crystal panel, a second substrate 102 is fixed by a sealing material 103 so as to face a first substrate 101 with a gap therebetween. Liquid crystal molecules are sealed between the first substrate 101 and the second substrate 102, and a liquid crystal layer 104 is formed.

The transistors 51, the photodiode 53, and the transistor 55 are formed using a semiconductor substrate including a single crystal semiconductor layer as illustrated in FIGS. 2A to 2C. As illustrated in FIG. 3, the transistors 51 and 55 and the photodiode 53 are formed over the first substrate 101 with an insulating film 105 therebetween. Semiconductor layers 106 of the transistors 51 and 55 and a photoelectric conversion layer 107 of the photodiode 53 are formed over the insulating film 105 by using a single crystal semiconductor layer. The first substrate 101 corresponds to the supporting substrate 40 in FIGS. 2A to 2C. The insulating film 105 corresponds to at least one of the buffer layers 42 and 43. The semiconductor layers 106 of the transistors 51 and 55 and the photoelectric conversion layer 107 of the photodiode 53 are formed using the single crystal semiconductor layer 41.

Each of the transistors 51 and 55 includes the semiconductor layer 106, a gate insulating film made of an insulating film 108, a gate electrode made of a conductive film 109, and a source electrode and a drain electrode made of conductive films 110. A channel formation region, a source region, and a drain region are formed in the semiconductor layer 106.

The photodiode 53 has two electrodes made of the photoelectric conversion layer 107 and the conductive film 110. The conductive film 109 formed over the photoelectric conversion layer 107 with the insulating film 108 interposed therebetween functions as a light shielding film. A PIN junction is formed in the photoelectric conversion layer 107.

The conductive film 110 is formed over an insulating film 111 which covers the conductive film 109. An insulating film 112 is formed to cover the conductive film 110. A pixel electrode 113 is formed over the insulating film 112. The pixel electrode 113 is electrically connected to the transistor 55 through the conductive film 110. Moreover, an insulating film 114 for maintaining the gap between the first substrate 101 and the second substrate 102 is formed over the insulating film 112. An alignment film 115 is formed to cover the pixel electrode 113 and the insulating film 114. The alignment film 115 is formed as necessary.

The pixel electrode 113 is a light-transmitting electrode through which light from the backlight unit 56 passes. Accordingly, as a conductive film forming the pixel electrode 113, an indium tin oxide film formed by mixing indium oxide with tin oxide, an indium tin silicon oxide film formed by mixing indium tin oxide with silicon oxide, an indium zinc oxide film formed by mixing indium oxide with zinc oxide, a zinc oxide film, a tin oxide film, or the like can be used.

The first substrate 101 is provided with an external connection terminal 58. The external connection terminal 58 is formed using a stacked-layer film of the conductive film 110 and a conductive film 116. The conductive film 116 is formed of the same conductive film as the pixel electrode 113. The external connection terminal 58 is a terminal for electrically connecting a circuit which is not formed over the first substrate 101 and a circuit which is formed over the first substrate 101 to each other. An FPC (flexible printed circuit) 118 is electrically connected to the external connection terminal 58 with an anisotropic conductive film 117.

On the other hand, a color filter 121 and a black matrix (hereinafter referred to as a BM) 122 are formed over the second substrate 102. An opposite electrode 123 is formed over the color filter 121 and the BM 122. An alignment film 124 is formed to cover the opposite electrode 123. The liquid crystal element 54 is formed with a structure where the liquid crystal layer 104 is interposed between the pixel electrode 113 and the opposite electrode 123.

When a user sees the display portion 11 from the first substrate 101 side, he or she can understand an image. Moreover, when the user touches the first substrate 101 side with a finger 59 or the like, he or she can input information.

Illumination light 57 emitted from a light source of the backlight unit 56 illuminates the display portion 11. The illumination light 57 passes through the second substrate 102 and the color filter 121, whereby only a predetermined wavelength component is extracted. The illumination light 57 passes through the liquid crystal layer 104, the pixel electrode 113, and the first substrate 101 and is extracted to the outside of the display portion 11. As illustrated in FIG. 3, when the display portion 11 is touched with the finger 59 or the like, the illumination light 57 passing through the first substrate 101 is reflected and enters the photoelectric conversion layer 107 of the photodiode 53. Accordingly, by analyzing a signal detected by the photodiode 53, it is possible to detect which pixel 21 in the display portion 11 is touched with the finger 59.

In the input device 10 of FIG. 3, the photodiode 53 is provided with the light shielding film (the conductive film 109), whereby light entering from the second substrate 102 side can be shielded.

As the light source of the backlight unit 56, a cold cathode fluorescent lamp, a light-emitting diode (hereinafter referred to as an LED), or the like can be used. It is preferable to use the LED. The LED is made to emit light intermittently and the detection signal of the photodiode 53 is read in synchronization with the light-emitting period, whereby noise due to external light or the like can be reduced.

Further, the backlight unit 56 may be provided with an LED that emits infrared light which is invisible to the human eye as well as an LED that emits light in a visible light region for displaying an image. As such an LED, an LED having a light emission spectrum with a peak at a wavelength of equal to or greater than 800 nm and equal to or less than 1 μm may be used. This is because, when a single crystal silicon layer is used as the photoelectric conversion layer 107 of the photodiode 53, the light reception sensitivity of the photodiode 53 is high in a wavelength region of equal to or greater than 800 nm and equal to or less than 1 µm. By using light which is invisible to the human eye, it becomes easy to design so that color of an image for the display portion 11 is made optimal by the illumination light 57 of the backlight unit 56 and the color filter 121, and position detection with high accuracy can be performed by the photodiode 53.

Note that although a TN (twisted nematic) mode is employed as a display method of the display portion 11 in FIG. 3, another method, for example, an MVA (multi-domain vertical alignment) mode, a PVA (patterned vertical alignment) mode, an IPS (in-plane-switching) mode, an FFS (fringe field switching) mode, an ASM (axially symmetric aligned micro-cell) mode, an OCB (optically compensated bend) mode, an FLC (ferroelectric liquid crystal) mode, or an AFLC (antiferroelectric liquid crystal) mode can be employed.

In the input device 10 of FIG. 4, the display portion 11 forms an active matrix EL panel. FIG. 4 illustrates two transistors 61 as a cross section of the control circuit portion 50. Moreover, FIG. 4 illustrates one pixel 21 as a cross section of the display portion 11 and shows a photodiode 62 included in the optical sensor 22, and a transistor 63 and a light-emitting element 64 which are included in the pixel circuit.

As illustrated in FIG. 4, the transistors 61, the photodiode 62, the transistor 63, and the light-emitting element 64 are formed over a first substrate 141. In order to form the EL panel, a second substrate 142 is fixed by a resin layer 143 so as to face the first substrate 141. An ultraviolet curable resin or a thermosetting resin can be used for the resin layer 143.

The transistors 61 and 63 and the photodiode 62 are formed using a semiconductor substrate including a single crystal semiconductor layer as illustrated in FIGS. 2A to 2C. As illustrated in FIG. 4, the transistors 61 and 63 and the photodiode 62 are formed over the first substrate 141 with an insulating film 145 therebetween. Semiconductor layers 146 of the transistors 61 and 63 and a photoelectric conversion layer 147 of the photodiode 62 are formed over the insulating film 145 by using a single crystal semiconductor layer. The first substrate 141 corresponds to the supporting substrate 40 in FIGS. 2A to 2C. The insulating film 145 corresponds to at least one of the buffer layers 42 and 43. The semiconductor layers 146 of the transistors 61 and 63 and the photoelectric conversion layer 147 of the photodiode 62 are formed using the single crystal semiconductor layer 41.

Each of the transistors 61 and 63 includes the semiconductor layer 146, a gate insulating film made of an insulating film 148, a gate electrode made of a conductive film 149, and a source electrode and a drain electrode made of conductive films 150. A channel formation region, a source region, and a drain region are formed in the semiconductor layer 146. Note that a pixel electrode 151 formed of the same conductive film as the conductive film 150 is connected to the transistor 63.

The photodiode 62 has two electrodes made of the photoelectric conversion layer 147 and the conductive film 150. A PIN junction is formed in the photoelectric conversion layer 147.

The conductive film 150 and the pixel electrode 151 are formed over an insulating film 153 which covers the conductive film 149. An insulating film 154 is formed to cover the conductive film 150 and the pixel electrode 151. An opening portion which exposes a top surface of the pixel electrode 151 is formed in the insulating film 154. In the opening portion, an EL layer 155 and an opposite electrode 156 are stacked over the pixel electrode 151. The light-emitting element 64 is formed with a structure where the EL layer 155 is interposed between the pixel electrode 151 and the opposite electrode 156.

The EL layer 155 includes at least a light-emitting layer. The EL layer 155 may include a hole injection layer, a hole transport layer, an electron transport layer, or an electron injection layer other than the light-emitting layer.

The pixel electrode 151 is a reflective electrode which reflects light 65 emitted from the EL layer 155. As a conductive film forming the pixel electrode 151, a metal film formed of tantalum, tungsten, titanium, molybdenum, aluminum, chromium, silver, or the like; or an alloy film or a conductive compound film of the above metal can be used.

The opposite electrode 156 is a light-transmitting electrode through which the light 65 passes. As a conductive film forming the opposite electrode 156, an indium tin oxide film formed by mixing indium oxide with tin oxide, an indium tin silicon oxide film formed by mixing indium tin oxide with silicon oxide, an indium zinc oxide film formed by mixing indium oxide with zinc oxide, a zinc oxide film, a tin oxide film, or the like can be used.

The first substrate 141 is provided with an external connection terminal 66. The external connection terminal 66 is formed using a stacked-layer film of the conductive films 149 and 150 and a conductive film 158. The conductive film 158 is formed of the same conductive film as the pixel electrode 151. The external connection terminal 66 is a terminal for electrically connecting a circuit which is not formed over the first substrate 141 and a circuit which is formed over the first substrate 141 to each other. An FPC 160 is electrically connected to the external connection terminal 66 with an anisotropic conductive film 159.

When a user sees the display portion 11 from the second substrate 142 side, he or she can understand an image. Moreover, when the user touches the second substrate 142 side with the finger 59 or the like, he or she can input information.

The light 65 passes through the second substrate 142 and is extracted to the outside of the display portion 11. As illustrated in FIG. 4, when the display portion 11 is touched with the finger 59 or the like, the light 65 passing through the second substrate 142 is reflected and enters the photoelectric conversion layer 147 of the photodiode 62. Accordingly, by analyzing a signal detected by the photodiode 62, it is possible to detect which pixel 21 in the display portion 11 is touched with the finger 59.

Lastly, the input device 10 of FIG. 5 is described. In the input device 10 of FIG. 5, the display portion 11 forms an active matrix EL panel in a similar manner to FIG. 4. The input device 10 of FIG. 5 is different from that of FIG. 4 in that the light 65 emitted from the light-emitting element 64 is extracted from the first substrate 141 side. Hereinafter, portions having different structures from FIG. 4 are described.

An insulating film 170 is formed to cover the conductive film 150. A pixel electrode 171 is formed over the insulating film 170 and electrically connected to the transistor 63. An insulating film 172 is formed to cover the pixel electrode 171. An opening portion which exposes a top surface of the pixel electrode 171 is formed in the insulating film 172. In the opening portion, the EL layer 155 and an opposite electrode 174 are stacked over the pixel electrode 171. The light-emitting element 64 is formed with a structure where the EL layer 155 is interposed between the pixel electrode 171 and the opposite electrode 174.

The pixel electrode 171 is a light-transmitting electrode through which the light 65 emitted from the EL layer 155 passes. As a conductive film forming the pixel electrode 171, an indium tin oxide film formed by mixing indium oxide with tin oxide, an indium tin silicon oxide film formed by mixing indium tin oxide with silicon oxide, an indium zinc oxide film formed by mixing indium oxide with zinc oxide, a zinc oxide film, a tin oxide film, or the like can be used.

The opposite electrode 174 is a reflective electrode which reflects the light 65 emitted from the EL layer 155. As a conductive film forming the opposite electrode 174, a metal film formed of tantalum, tungsten, titanium, molybdenum, aluminum, chromium, silver, or the like; or an alloy film or a conductive compound film of the above metal can be used.

The external connection terminal 66 is formed using a stacked-layer film of the conductive films 149 and 150 and a conductive film 175. The conductive film 175 is formed of the same conductive film as the pixel electrode 171.

When a user sees the display portion 11 from the first substrate 141 side, he or she can understand an image. Moreover, when the user touches the first substrate 141 side with the finger 59 or the like, he or she can input information.

The light 65 passes through the first substrate 141 and is extracted to the outside of the display portion 11. As illustrated in FIG. 5, when the display portion 11 is touched with the finger 59 or the like, the light 65 passing through the first substrate 141 is reflected and enters the photoelectric conversion layer 147 of the photodiode 62. Accordingly, by analyzing a signal detected by the photodiode 62, it is possible to detect which pixel 21 in the display portion 11 is touched with the finger 59.

Note that in FIGS. 4 and 5, the light-emitting element 64 is made to emit light intermittently and the detection signal of the photodiode 62 is read in synchronization with the light-emitting period, whereby noise due to external light or the like can be reduced.

Embodiment Mode 2

In this embodiment mode, a structure of the display portion 11 including a liquid crystal element as a display element, as in FIG. 3, is described.

Figure 6A:
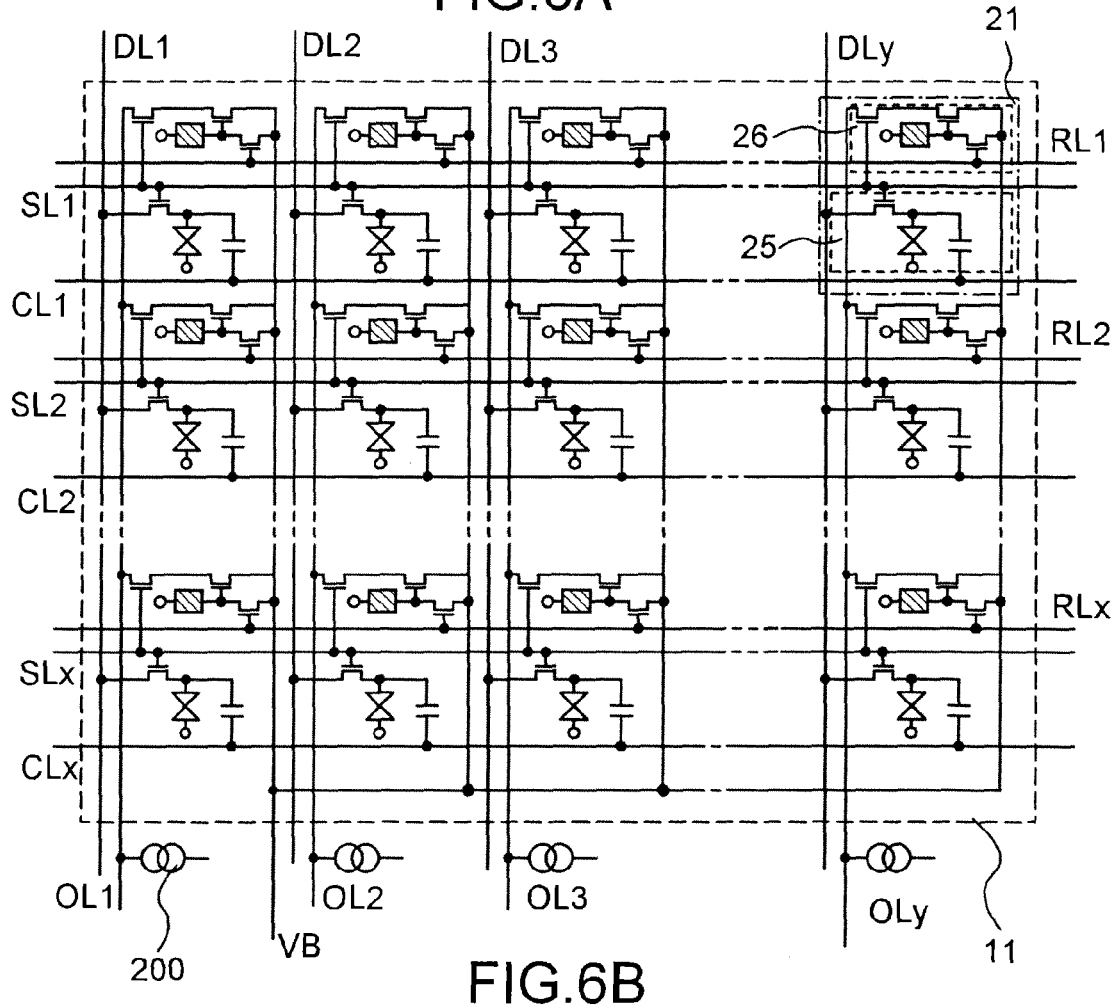
FIG. 6A is a circuit diagram illustrating a structural example of a display portion in which a liquid crystal element is formed.
Figure 6B:
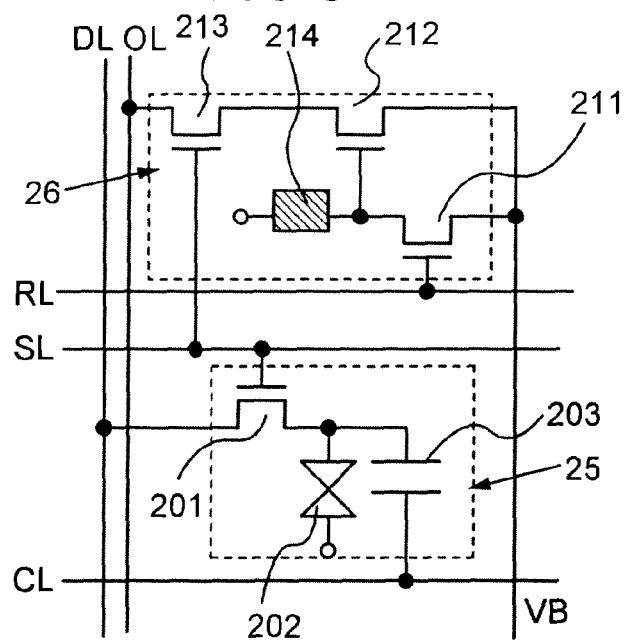
FIG. 6B is a circuit diagram of a pixel circuit.

FIG. 6A is a circuit diagram illustrating a structural example of the display portion 11, and FIG. 6B is a circuit diagram of one pixel 21.

The display portion 11 includes the pixels 21 arranged in x rows and y columns. The pixel 21 includes a pixel circuit 25 including a liquid crystal element and a sensor circuit 26 including an optical sensor.

Moreover, in the display portion 11, x scan lines SL1 to SLx, y data lines DL1 to DLy, x capacitor lines CL1 to CLx, x reset scan lines RL1 to RLx, y output lines OL1 to OLy for sensors, and y power supply lines VB for sensors are provided. Note that in FIG. 6B, reference marks representing the order of the signal lines are omitted.

The scan lines SL1 to SLx are connected to the scan line driver circuit 12. The data lines DL1 to DLy are connected to the data line driver circuit 13. The reset scan lines RL1 to RLx are connected to the scan line driver circuit 14 for sensors. The output lines OL1 to OLy for sensors are connected to the data line driver circuit 15 for sensors. A constant current power supply 200 is connected to each of the output lines OL1 to OLy for sensors. The output lines OL1 to OLy for sensors are connected to the respective constant current power supplies 200, and constant current is supplied to the output lines OL1 to OLy for sensors. Further, they power supply lines VB for sensors are connected to a common power supply circuit. Each of the power supply lines VB for sensors is held at a constant potential (a reference potential).

The pixel 21 includes the pixel circuit 25 and the sensor circuit 26. The pixel circuit 25 includes a switching transistor 201, a liquid crystal element 202, and a storage capacitor 203. A gate electrode of the switching transistor 201 is connected to the scan line SL. One of a source region and a drain region of the switching transistor 201 is connected to the data line DL, and the other thereof is connected to a pixel electrode of the liquid crystal element 202. One electrode of the storage capacitor 203 is connected to the pixel electrode of the liquid crystal element 202, and the other electrode thereof is connected to the capacitor line CL.

The sensor circuit 26 includes a reset transistor 211, a buffer transistor 212, a selection transistor 213, and a photodiode 214. A gate electrode of the reset transistor 211 is connected to the reset scan line RL. A source region of the reset transistor 211 is connected to the power supply line VB for sensors. A drain region of the reset transistor 211 is connected to a gate electrode of the buffer transistor 212 and the photodiode 214. A drain region of the buffer transistor 212 is also connected to the power supply line VB for sensors.

A gate electrode of the selection transistor 213 is connected to the scan line SL. One of a source region and a drain region of the selection transistor 213 is connected to a source region of the buffer transistor 212, and the other thereof is connected to the output line OL for sensors.

Figure 7:
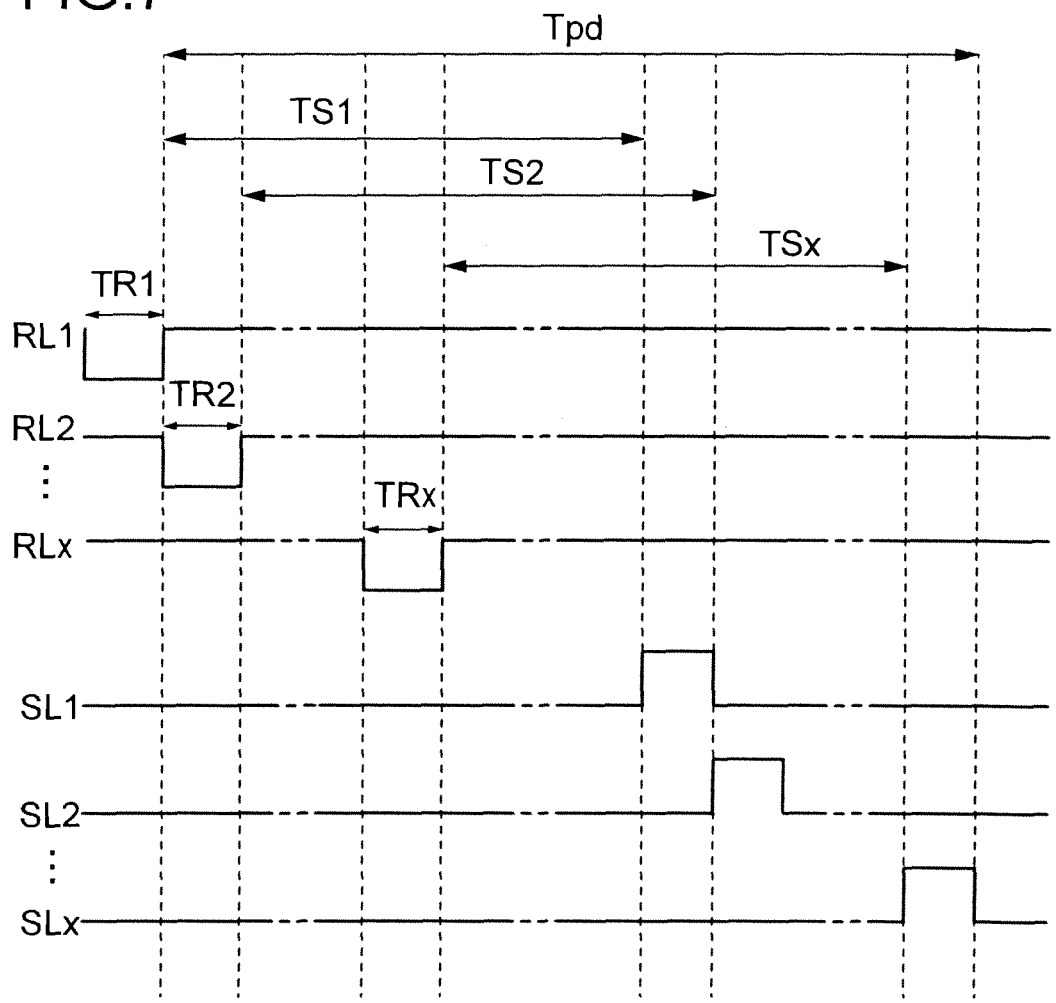
FIG. 7 is a timing chart illustrating a method for operating a sensor circuit.

Next, a method for operating the sensor circuit 26 is described. FIG. 7 is a timing chart of the sensor circuit 26.

The reset transistor 211, the buffer transistor 212, and the selection transistor 213 may be an n-channel transistor or a p-channel transistor. Here, for convenience of explanation, the reset transistor 211 is an n-channel transistor, the buffer transistor 212 is a p-channel transistor, and the selection transistor 213 is an n-channel transistor. Note that it is preferable that polarity of the reset transistor 211 and polarity of the buffer transistor 212 be different from each other.

First, by a signal of the reset scan line RL1, all the reset transistors 211 connected to the reset scan line RL1 are placed in a conductive state, and the other reset transistors 211, which are connected to the reset scan lines RL2 to RLx, are in a non-conductive state. This state is regarded as a selection state of the reset scan line RL1. At this time, in each sensor circuit 26 in the first row, a potential of the power supply line VB for sensors is supplied to the gate electrode of the buffer transistor 212 through the reset transistor 211. Accordingly, reverse bias voltage is applied between the electrodes of the photodiode 214.

At this time, the source region of the buffer transistor 212 is held at a potential obtained by subtracting a potential difference between the source region and the gate region of the buffer transistor 212 from the potential (the reference potential) of the power supply line VB for sensors. Moreover, by the signal of the scan line SL1, all the selection transistors 213 connected to the scan line SL1 are in a non-conductive state. Note that a period during which the reset scan line RL is selected is referred to as a reset period TR. Moreover, in FIG. 7, Tpd represents a period during which the amount of light received by the photodiodes 214 in all the pixels 21 is read.

Next, a potential of the reset scan line RL1 is changed, and all the reset transistors 211 in a corresponding row are placed in a non-conductive state. This state is referred to as a non-selection state of the reset scan line RL1. At the same time, the reset scan line RL2 is placed in a selection state.

When the reset scan line RL1 is in a non-selection state and the photodiode 214 in a corresponding row is irradiated with light, current flows between the electrodes of the photodiode 214, and the reverse bias voltage between the electrodes of the photodiode 214, which is applied in a reset period TR1, is lowered. After that, by a signal input to the scan line SL1, the selection transistor 213 in a corresponding row is placed in a conductive state.

A period after the reset scan line RL1 is placed in a non-selection state until the selection transistor 213 in the same row is selected is referred to as a sampling period TS1. The same can be applied to other rows.

In the sampling period TS1, the reverse bias voltage between the electrodes of the photodiode 214 is reduced as time passes. The amount of change in reverse bias voltage is proportional to the intensity of light with which a photoelectric conversion layer of the photodiode 214 is irradiated. In the sensor circuit 26, one electrode of the photodiode 214 is held at a constant potential. Accordingly, in the photodiode 214, a potential of the electrode connected to the gate electrode of the buffer transistor 212 is reduced. That is, a potential of the gate electrode of the buffer transistor 212 is reduced.

In the sensor circuit 26, the source region of the buffer transistor 212 is connected to the constant current power supply 200, whereby the buffer transistor 212 functions as a source follower. That is, voltage between the gate and the source of the buffer transistor 212 is always held to be the same. Accordingly, by changing a potential between the electrodes of the photodiode 214, a potential of the gate electrode of the buffer transistor 212 is changed, and a potential of the source region of the buffer transistor 212 is also changed with the same amount of change. When the scan line SL1 is selected after the sampling period TS1, the sampling period TS1 ends, and change in potential of the source region of the buffer transistor 212 is output to the output lines OL1 to OLy for sensors.

On the other hand, when the reset scan line RL1 is placed in a non-selection state, the reset scan line RL2 is placed in a selection state, and a reset period TR2 starts. After that, the reset scan line RL2 is placed in a non-selection state, and a sampling period TS2 starts. Input of signals as described above is performed by the reset scan lines RL1 to RLx and scan lines SL1 to SLx, whereby the amount of light received by the photodiodes 214 in all the pixels 21 can be read as a voltage signal in one frame period.

In the display portion 11, the display element in the pixel circuit 25 emits light with predetermined luminance, and an image is displayed. At the same time, the amount of light received by the optical sensor is detected in the sensor circuit, whereby display of the image and input of information by touching can be performed simultaneously.

Note that in the sensor circuit 26, instead of connecting the gate electrode of the selection transistor 213 to the scan line SL, a scan line for sensors may be provided in each row for the selection transistor 213, and the gate electrode of the selection transistor 213 in each row may be connected to the respective scan lines for sensors. The scan line for sensors is connected to the scan line driver circuit 14 for sensors. Signals are supplied from the scan line driver circuit 14 for sensors to the reset scan line RL and the scan line for sensors, and the reset period TR and the sampling period TS are controlled.

This embodiment mode can be implemented in combination with other embodiment modes as appropriate.

Embodiment Mode 3

In this embodiment mode, a structure of the display portion 11 including a light-emitting element as a display element, as in FIGS. 4 and 5, is described.

Figure 8A:
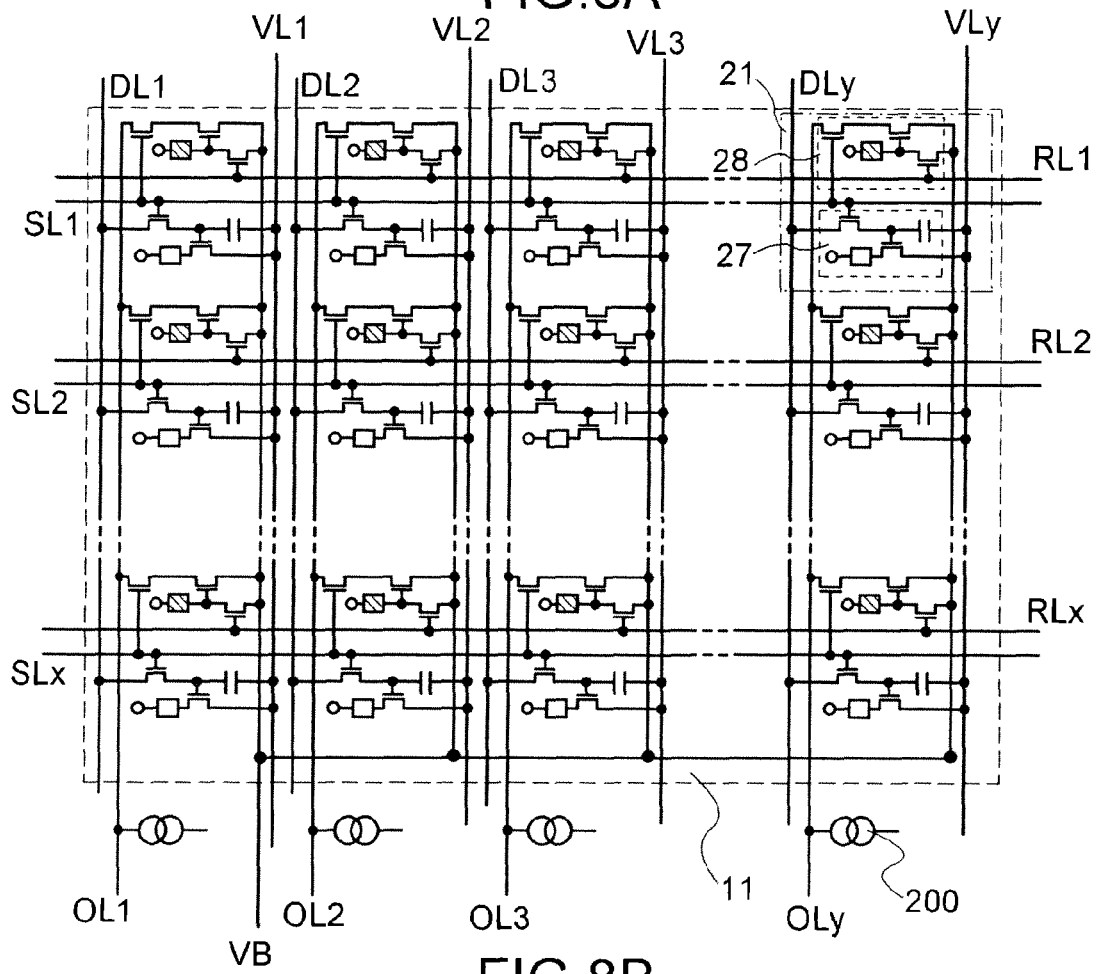
FIG. 8A is a circuit diagram illustrating a structural example of a display portion in which a light-emitting element is formed.
Figure 8B:
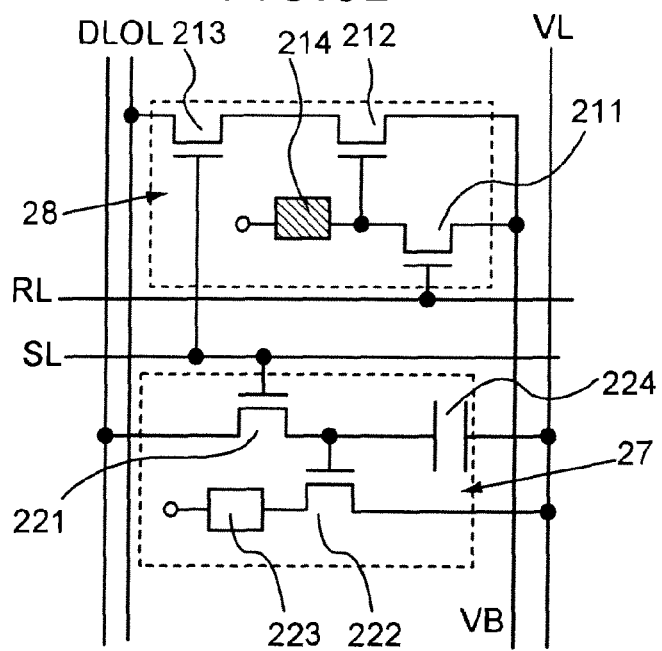
FIG. 8B is a circuit diagram of a pixel circuit.

FIG. 8A is a circuit diagram illustrating a structural example of the display portion 11, and FIG. 8B is a circuit diagram of one pixel 21. The display portion 11 includes the pixels 21 arranged in x rows and y columns. The pixel 21 includes a pixel circuit 27 including a light-emitting element and a sensor circuit 28 including an optical sensor.

In the display portion 11, the x scan lines SL1 to SLx, the y data lines DL1 to DLy, y power supply lines VL1 to VLy for light-emitting elements, the x reset scan lines RL1 to RLx, the y output lines OL1 to OLy for sensors, and the y power supply lines VB for sensors are provided. Note that in FIG. 8B, reference marks representing the order of the signal lines are omitted.

The scan lines SL1 to SLx are connected to the scan line driver circuit 12. The data lines DL1 to DLy are connected to the data line driver circuit 13. The reset scan lines RL1 to RLx are connected to the scan line driver circuit 14 for sensors. The output lines OL1 to OLy for sensors are connected to the data line driver circuit 15 for sensors. The constant current power supply 200 is connected to each of the output lines OL1 to OLy for sensors. The output lines OL1 to OLy for sensors are connected to the respective constant current power supplies 200, and constant current is supplied to the output lines OL1 to OLy for sensors. Further, the y power supply lines VB for sensors are connected to a common power supply circuit. A potential of each of the power supply lines VB for sensors is held at a constant potential (a reference potential).

The pixel circuit 27 includes a selection transistor 221, a display control transistor 222, a light-emitting element 223, and a storage capacitor 224. A gate electrode of the selection transistor 221 is connected to the scan line SL. One of a source region and a drain region of the selection transistor 221 is connected to the data line DL, and the other thereof is connected to a gate electrode of the display control transistor 222. One of a source region and a drain region of the display control transistor 222 is connected to the power supply line VL for light-emitting elements, and the other thereof is connected to the light-emitting element 223. One electrode of the storage capacitor 224 is connected to the gate electrode of the display control transistor 222, and the other electrode thereof is connected to the power supply line VL for light-emitting elements.

Since each of the transistors 221 and 222 is formed using a single crystal semiconductor layer, variation in threshold voltage value can be suppressed. Accordingly, it is not necessary to provide a compensation circuit for threshold voltage values in the pixel circuit 27, and the pixel circuit 27 can have a structure where the number of transistors is the smallest, as illustrated in FIG. 8B.

A circuit structure of the sensor circuit 28 is similar to that in FIG. 6B, and the sensor circuit 28 is operated in a similar manner to FIG. 6B. Note that also in the sensor circuit 28, instead of connecting the gate electrode of the selection transistor 213 to the scan line SL, a scan line for sensors may be provided in each row for the selection transistor 213, and the gate electrode of the selection transistor 213 in each row may be connected to the respective scan lines for sensors. The scan line for sensors is connected to the scan line driver circuit 14 for sensors. Signals are supplied from the scan line driver circuit 14 for sensors to the reset scan line RL and the scan line for sensors, and the reset period TR and the sampling period TS are controlled (see FIG. 7).

This embodiment mode can be implemented in combination with other embodiment modes as appropriate.

Embodiment Mode 4

The present invention can be applied to an electronic device provided with a display portion. Examples of such an electronic device include cameras such as video cameras and digital cameras, navigation systems, audio reproducing devices (e.g., portable digital music players, car audio systems, and audio component sets), notebook computers, game machines, portable information terminals (e.g., mobile computers, mobile phones, portable game machines, and e-book readers), and image reproducing devices (specifically, a device for reproducing image data and audio data stored in a storage medium such as a digital versatile disc (DVD)).

First, an example in which the input device of the present invention is applied to a PDA is described. FIG. 9 is an external view of a PDA. In a PDA 1000, a system illustrated in FIG. 1 is incorporated in a housing 1001. The PDA 1000 includes a display portion 1002, an operation button 1003, and an external connection port 1004. By touching the display portion 1002 with a pen, a finger, or the like, information can be input to the PDA 1000.

There are mainly three screen modes of the display portion 1002. The first mode is a display mode mainly for displaying an image. The second mode is an input mode mainly for inputting information such as text. The third mode is a display-and-input mode in which two modes of the display mode and the input mode are mixed.

Figure 10A:
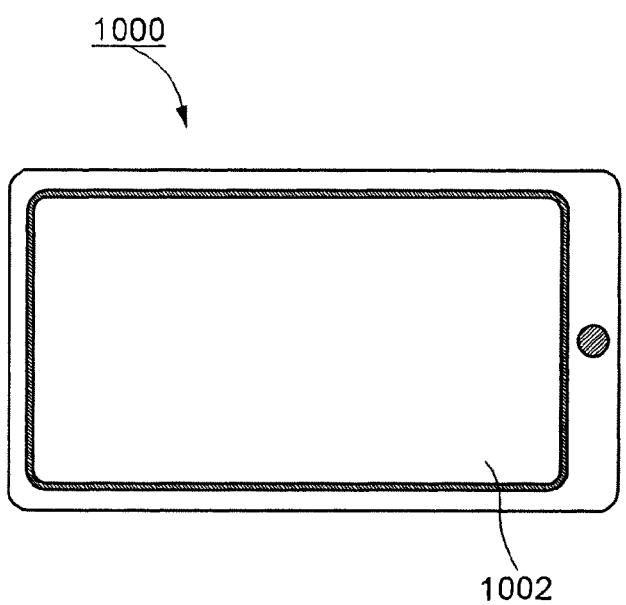
FIGS. 10A to 10D are front views of a PDA for illustrating a screen in a display mode.
Figure 10B:
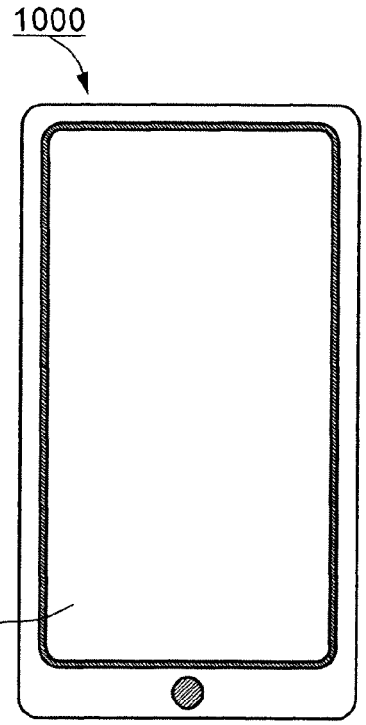
Figure 10C:
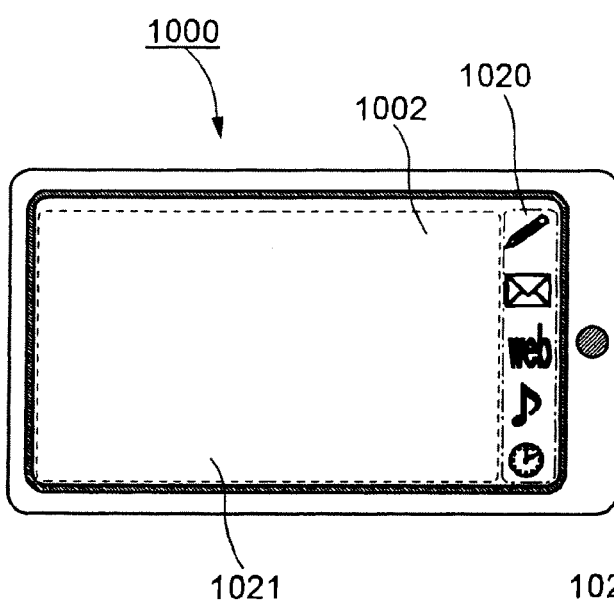
Figure 10D:
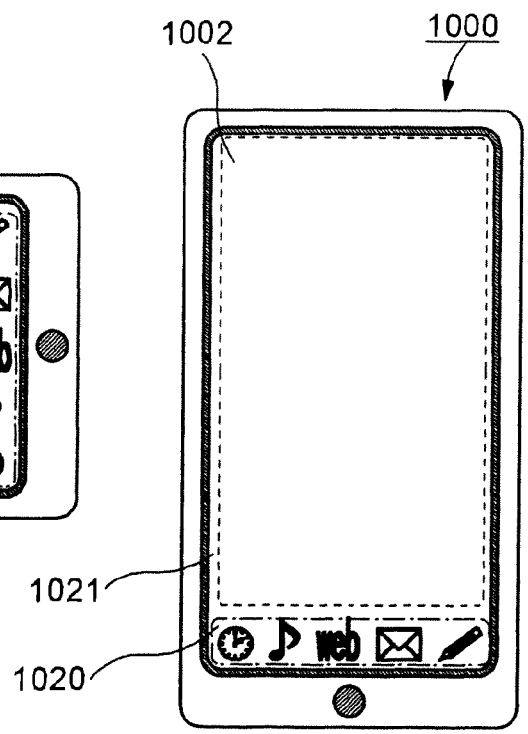

FIGS. 10A to 10D are front views of the PDA 1000 for illustrating a screen in the display mode. FIGS. 10A and 10C illustrate the screen when the PDA 1000 is laid down on its sides. FIGS. 10B and 10D illustrate the screen when the PDA 1000 is made to stand upright.

The display mode is a mode in which the PDA 1000 is used as a display. A still image and a moving image are displayed in the display portion 1002 (see FIGS. 10A and 10B). Various kinds of image data can be displayed in the display portion 1002; for example, a still image and a moving image stored in the memory circuit 19 are displayed, television is displayed by receiving a television broadcasting electric wave, and a homepage is displayed by connecting with the Internet.

In the display mode, as illustrated in FIGS. 10C and 10D, icons 1020 by which an operation menu can be selected may be displayed on part of the screen of the display portion 1002. When a user touches the icon 1020, display is switched to a corresponding menu. For example, when the user listens to music, he or she touches the music note icon 1020. In this case, a still image and a moving image are displayed on a screen 1021 surrounded by dotted lines in the display portion 1002.

Figure 11A:
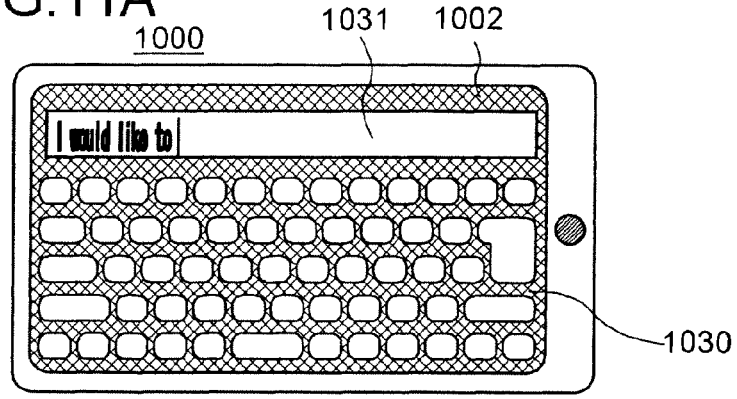
FIG. 11A is a front view of a PDA for illustrating a screen in an input mode.

FIG. 11A is a front view of the PDA 1000 for illustrating a screen in the input mode. As illustrated in FIG. 11A, a keyboard 1030 is displayed in the display portion 1002. Letters input from the keyboard 1030 are displayed on a screen 1031. Since an input operation of letters precedes in the input mode, the keyboard 1030 is displayed on most part of the screen in the display portion 1002. Key arrangement of the keyboard 1030 is changed depending on a language to be used.

A method for inputting a letter in the input mode is described. The user has only to touch the key of the letter that he or she wants to enter in the keyboard 1030 with his or her finger or the point of a pen. For example, when the user touches the key of the letter "A", selection of the key of the letter "A" is detected from a detection signal of an optical sensor provided in the display portion 1002, and "A" is displayed on the screen 1031.

Figure 11B:
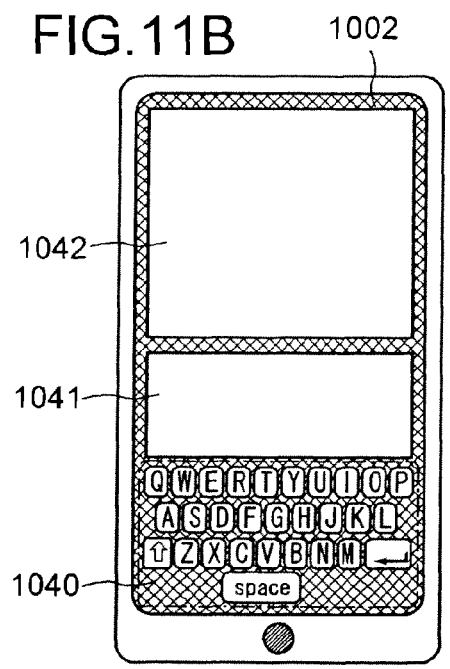
FIGS. 11B to 11D are front views of a PDA for illustrating a screen in a display-and-input mode.
Figure 11C:
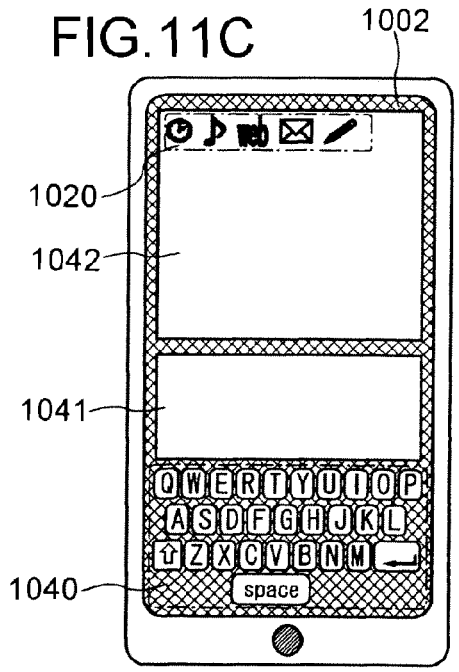
Figure 11D:
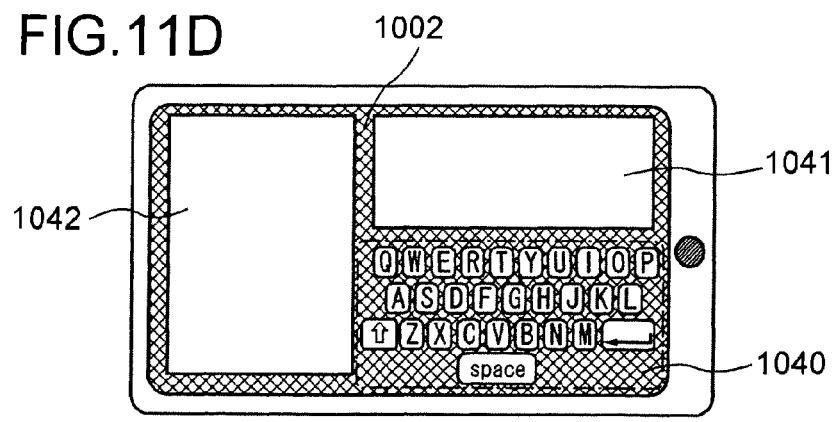

FIGS. 11B to 11D are front views of the PDA 1000 for illustrating a screen in the display-and-input mode. FIGS. 11B and 11C illustrate the screen when the PDA 1000 is made to stand upright. FIG. 11D illustrates the screen when the PDA 1000 is laid down on its sides.

As illustrated in FIGS. 11B to 11D, a keyboard 1040 is displayed in the display portion 1002. A screen 1041 corresponds to the screen in the input mode, on which a letter input from the keyboard 1040 is displayed. The letter can be input by touching the key of the letter in the keyboard 1040 with the finger or the point of a pen in a similar manner to the input mode. A screen 1042 corresponds to the screen in the display mode, on which a still image and a moving image are displayed in a similar manner to the display mode. Key arrangement of the keyboard 1040 can be changed depending on a language to be used. Here, the keyboard 1040 with the QWERTY layout is displayed in the display portion 1002.

Note that as illustrated in FIG. 11C, the icons 1020 by which an operation menu is selected can be displayed on the screen 1042.

When a detection device including a sensor for detecting inclination, such as a gyroscope or an acceleration sensor, is provided inside the PDA 1000, display in the screen of the display portion 1002 can be automatically switched by determining the direction of the PDA 1000 (whether the PDA 1000 stands upright or is laid down on its side).

Further, the screen modes are switched by touching the display portion 1002 or operating the operation button 1003. Alternatively, the screen modes can be switched depending on kinds of images displayed in the display portion 1002. For example, when a signal for an image displayed in the display portion is data of moving images, the screen mode is switched to the display mode. When the signal is text data, the screen mode is switched to the input mode.

Moreover, in the input mode, when input by touching the display portion 1002 is not performed within a specified period while a signal detected by the optical sensor in the display portion 1002 is detected, the screen mode may be controlled so as to be switched from the input mode to the display mode.

The display portion 1002 can also function as an image sensor. For example, an image of a palm print, a fingerprint, a finger vein, or the like is taken by touching the display portion 1002 with the palm or the finger, whereby personal authentication can be performed.

Figure 12A:
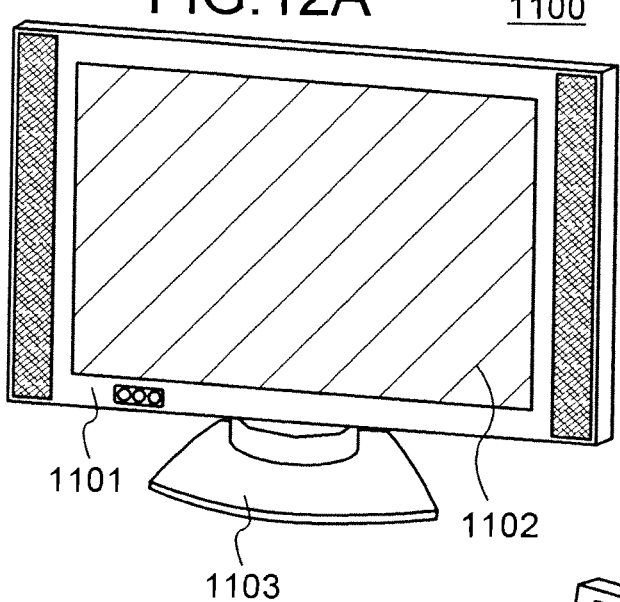
FIGS. 12A to 12C are external views of electronic devices each including an input device.
Figure 12B:
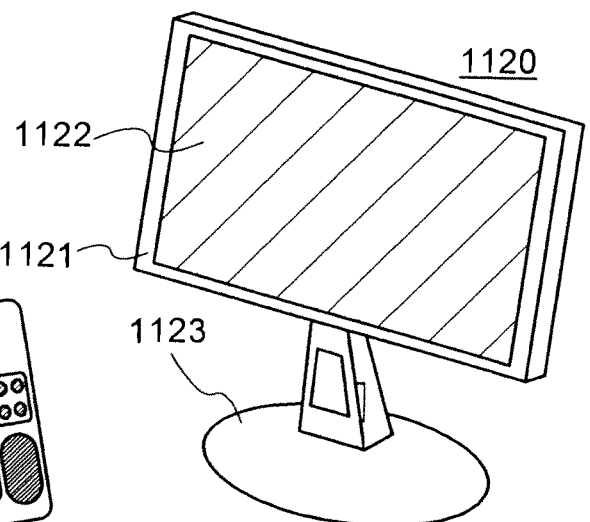
Figure 12C:
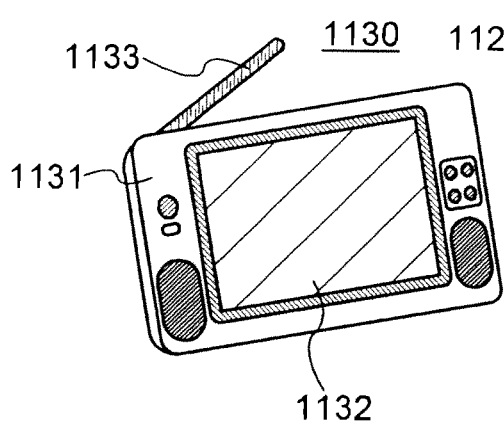

The input device of the present invention can be applied to a variety of electronic devices including a display portion as well as the PDA. FIGS. 12A to 12C illustrate examples of such electronic devices.

FIG. 12A is an external view of a television device 1100. The television device 1100 includes a housing 1101, a display portion 1102, a support base 1103, and the like. The input device of the present invention is incorporated in the housing 1101. An optical sensor is provided in a pixel of the display portion 1102. The display portion 1102 has a display function and an information input function.

FIG. 12B is an external view of a monitor 1120. The monitor 1120 includes a housing 1121, a display portion 1122, a support base 1123, and the like. The input device of the present invention is incorporated in the housing 1121. An optical sensor is provided in a pixel of the display portion 1122. The display portion 1122 has a display function and an information input function.

FIG. 12C is an external view of a portable television device 1130. The portable television device 1130 includes a housing 1131, a display portion 1132, an antenna 1133, and the like. The input device of the present invention is incorporated in the housing 1131. An optical sensor is provided in a pixel of the display portion 1132. The display portion 1132 has a display function and an information input function.

This embodiment mode can be implemented in combination with other embodiment modes as appropriate.

Embodiment Mode 5

Although the optical sensor 22 is provided in all the pixels 21 of the display portion 11 in the structural example of FIG. 1, the optical sensor 22 may be provided in some of the pixels. In this embodiment mode, a structural example of such a display portion 11 is described.

Figure 13:
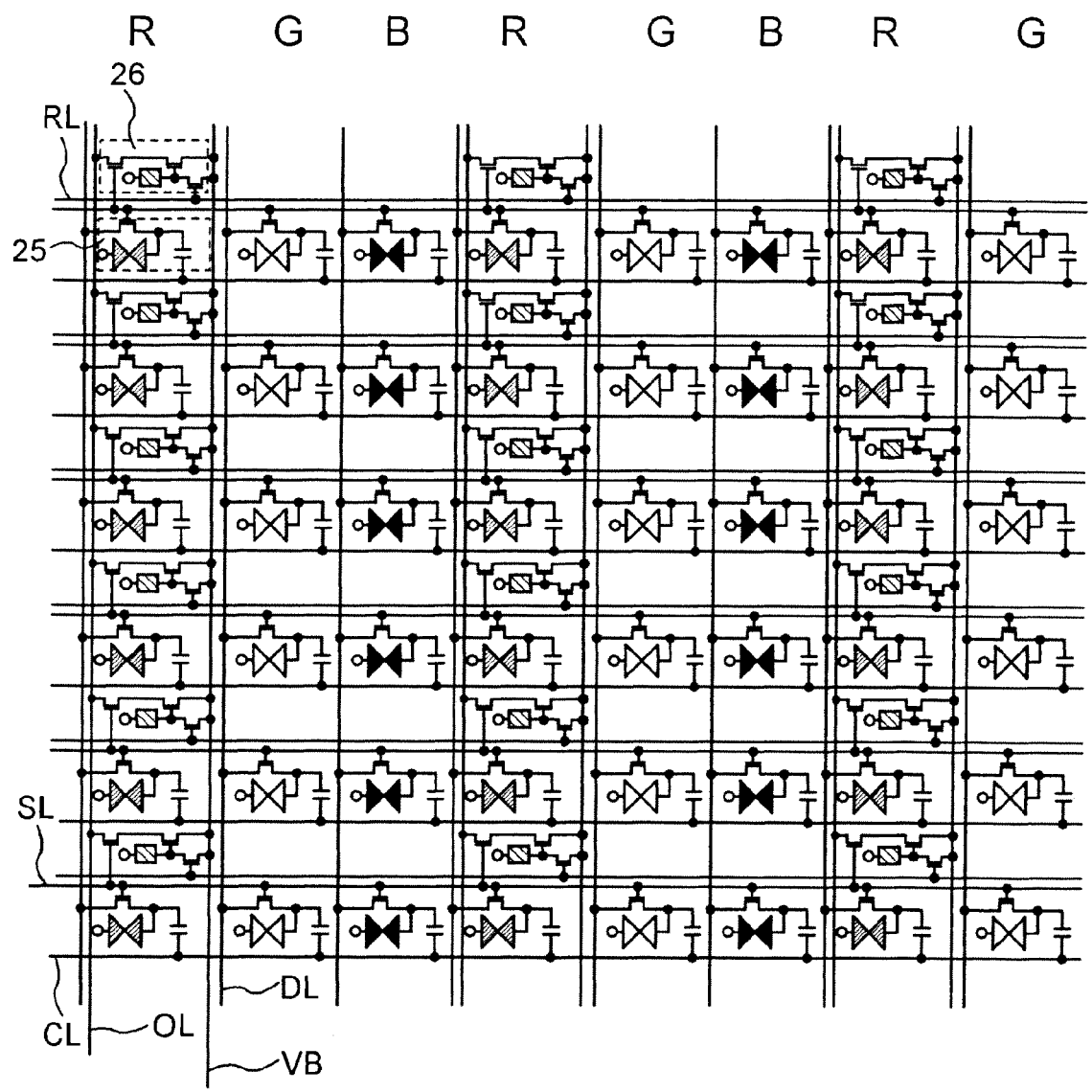
FIG. 13 is a circuit diagram illustrating a structural example of a display portion in which a liquid crystal element is formed.

First, a structural example of the display portion 11 including a liquid crystal element as a display element, as in FIG. 3, is described. FIG. 13 is a circuit diagram illustrating a structural example of the display portion 11 and shows a modified example of the display portion 11 in FIG. 6A. FIG. 13 illustrates pixels in 6 rows and 8 columns, and reference marks representing the order of signal lines are omitted.

In the display portion 11, a pixel for displaying red (R) (hereinafter referred to as an R-pixel), a pixel for displaying green (G) (hereinafter referred to as a G-pixel), and a pixel for displaying blue (B) (hereinafter referred to as a B-pixel) are provided for respective columns. In this embodiment mode, the pixel circuit 25 and the sensor circuit 26 are provided in the R-pixel, whereas only the pixel circuit 25 is provided in the G-pixel and the B-pixel without the provision of the sensor circuit 26. Structures of the pixel circuit 25 and the sensor circuit 26 are similar to those in FIG. 6B.

Figure 14:
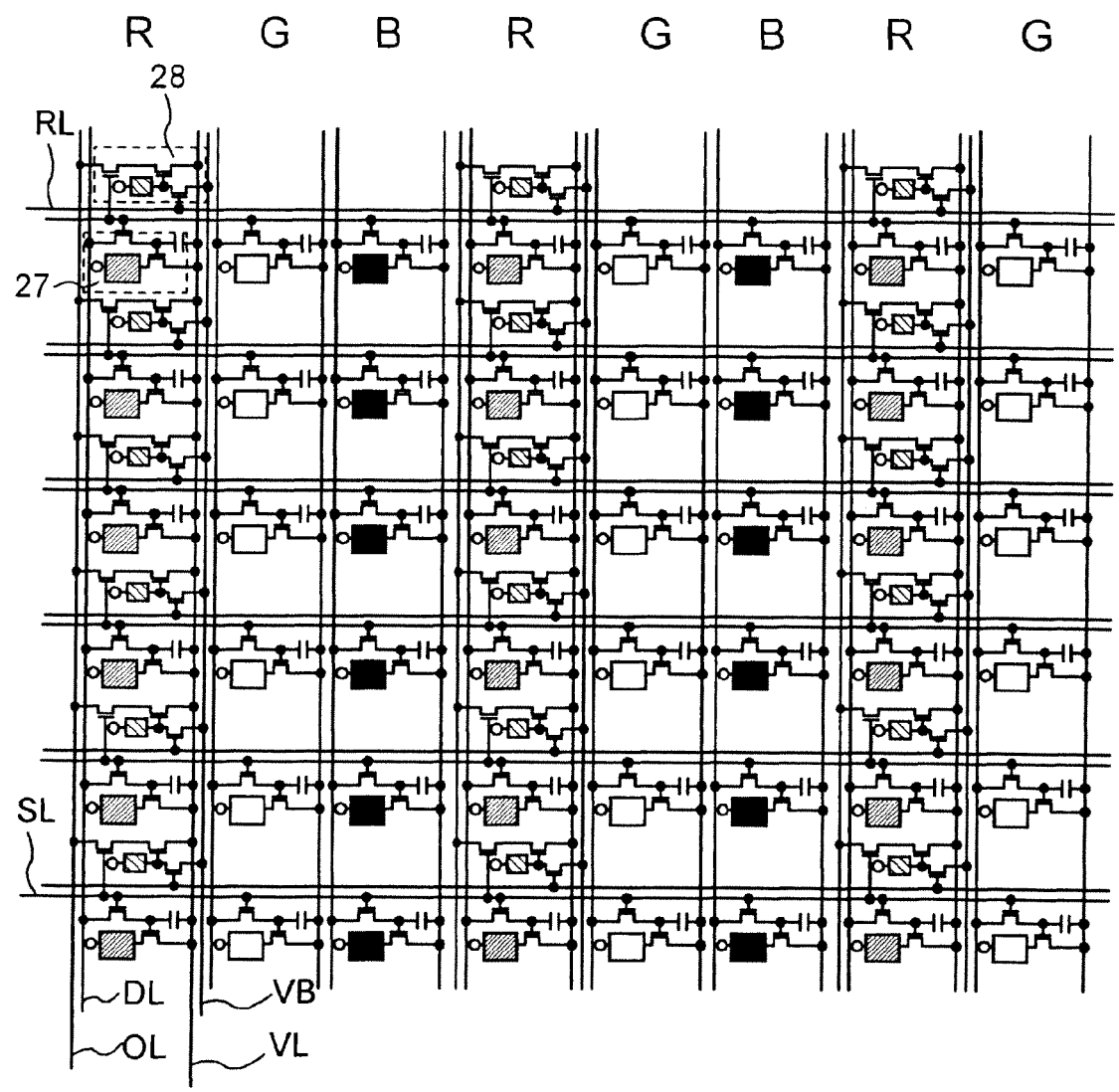
FIG. 14 is a circuit diagram illustrating a structural example of a display portion in which a light-emitting element is formed.

Next, a structural example of the display portion 11 including a light-emitting element as a display element, as in FIGS. 4 and 5, is described. FIG. 14 is a circuit diagram illustrating a structural example of the display portion 11 and shows a modified example of the display portion 11 in FIG. 8A. FIG. 14 illustrates pixels in 6 rows and 8 columns, and reference marks representing the order of signal lines are omitted.

In the display portion 11, an R-pixel, a G-pixel, and a B-pixel are provided for respective columns. In this embodiment mode, the pixel circuit 27 and the sensor circuit 28 are provided in the R-pixel, whereas only the pixel circuit 27 is provided in the G-pixel and the B-pixel without the provision of the sensor circuit 28. Structures of the pixel circuit 27 and the sensor circuit 28 are similar to those in FIG. 8B.

When a single crystal silicon layer is used for the photoelectric conversion layer of the photodiode 214 in the sensor circuits 26 and 28, the light reception sensitivity of the photodiode 214 is low in a wavelength region of 600 nm or more. That is, change in signal intensity is small when green light and blue light emitted from the G-pixel and the B-pixel are received by the photodiode 214. Accordingly, in this embodiment mode, the sensor circuit 26 or the sensor circuit 28 is provided only in the R-pixel emitting red light for which the light reception sensitivity of the photodiode 214 is high.

With such a structure, the output line OL for sensors and the power supply line VB for sensors are not provided in the columns where the G-pixel or the B-pixel is provided, whereby integration of pixels can be improved. Accordingly, the display portion 11 with high definition can be formed.

Embodiment Mode 6

In this embodiment mode, a method for manufacturing a semiconductor substrate for forming a display portion, a pixel driver circuit, and a sensor driver circuit is described. In this embodiment mode, as an example of a method for manufacturing a semiconductor substrate, a method for manufacturing a semiconductor substrate having a stacked-layer structure similar to that of the semiconductor substrate 31 illustrated in FIG. 2A is described.

FIGS. 15A-1 to 15A-3 and 15B to 15D are cross-sectional views illustrating a method for manufacturing a semiconductor substrate.

Figures 1, 15A:
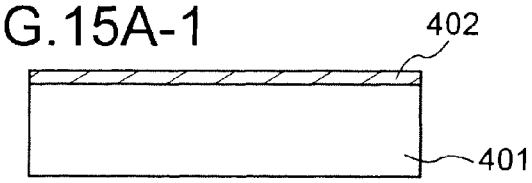

First, a single crystal semiconductor substrate 401 is prepared (see FIG. 15A-1). As the single crystal semiconductor substrate 401, a commercial semiconductor substrate such as a single crystal silicon substrate or a single crystal germanium substrate can be used, for example. As a commercial single crystal silicon substrate, circular wafers with a diameter of 5 inches (125 mm), 6 inches (150 mm), 8 inches (200 mm), 12 inches (300 mm), and 18 inches (450 mm) are known. Note that the shape of the single crystal semiconductor substrate 401 is not limited to a circular shape, and a single crystal semiconductor substrate processed into a rectangular shape or the like can also be used.

Next, an insulating film 402 is formed on a surface of the single crystal semiconductor substrate 401 (see FIG. 15A-1).

The insulating film 402 can be formed using a silicon oxide film (SiOx) or a silicon oxynitride film (SiOxNy) (x>y) by a chemical vapor deposition method (hereinafter referred to as a CVD method), a sputtering method, or the like. Alternatively, an oxide film formed by oxidizing the single crystal semiconductor substrate 401 may be used. Although the single crystal semiconductor substrate 401 can be oxidized by dry thermal oxidation, it is preferable to add a halogen gas or a halogen compound gas to an oxidizing atmosphere. A typical example of such a gas is HCl. Alternatively, HF, $NF_3$, HBr, $Cl_2$, $ClF_3$, $BCl_3$, $F_2$, $Br_2$, or the like may be used. Moreover, the single crystal semiconductor substrate 401 can be oxidized by surface treatment with ozone water, hydrogen peroxide solution, sulfuric acid hydrogen peroxide mixture, or the like.

Further, it is preferable to use an insulating film having a smooth surface as the insulating film 402. For example, the insulating film 402 is formed so that the average surface roughness (Ra) of the surface is 0.5 nm or less and the root mean square roughness (Rms) is 0.6 nm or less, preferably the average surface roughness is 0.3 nm or less and the root mean square roughness (Rms) is 0.4 nm or less.

In addition, when the insulating film 402 is formed by a CVD method, a silicon oxide film can be formed using organosilane as a raw material, for example. With the use of the silicon oxide film formed using organosilane, the surface of the insulating film 402 can be made smooth.

As the organosilane, a compound containing silicon such as tetraethoxysilane (TEOS: $Si(OC_2H_5)_4$), tetramethylsilane (TMS: $Si(CH_3)_4$), trimethylsilane (($CH_3)_3SIH$), tetramethylcyclotetrasiloxane (TMCTS), octamethylcyclotetrasiloxane (OMCTS), hexamethyldisilazane (HMDS), triethoxysilane ($SiH(OC_2H_5)_3$), or trisdimethylaminosilane ($SiH(N(CH_3)_2)_3$) can be used.

Figures 2, 15A:
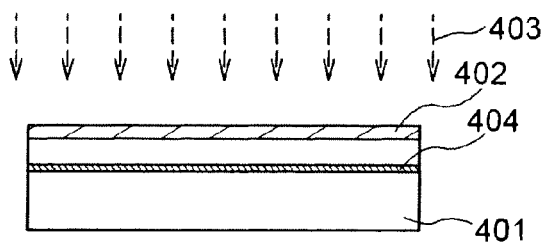
Figures 3, 15A:
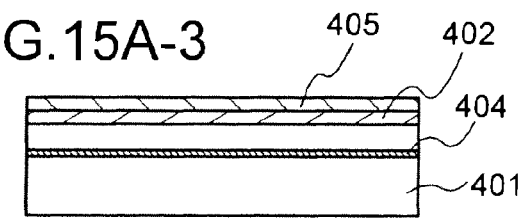

Next, the single crystal semiconductor substrate 401 is irradiated with ion beams 403 including ions accelerated by an electric field through the insulating film 402 to introduce the ions into a region at a predetermined depth from the surface of the single crystal semiconductor substrate 401, whereby a damaged region 404 is formed (see FIG. 15A-2).

The ion beams 403 are produced by exciting a source gas to generate plasma of the source gas and extracting ions contained in the plasma by an effect of an electric field. In order to introduce ions to the single crystal semiconductor substrate 401, an ion doping method without mass separation can be used. Alternatively, an ion doping method with mass separation may be used. As the source gas, a hydrogen gas, a halogen gas, a helium gas, or the like can be used.

The depth at which the damaged region 404 is formed can be adjusted by the acceleration energy and the incidence angle of the ion beams 403. The acceleration energy can be adjusted by acceleration voltage, the dose, or the like. The damaged region 404 is formed in a region at almost the same depth as the average depth at which the ions have entered. The thickness of a semiconductor layer to be separated from the single crystal semiconductor substrate 401 is determined by the depth at which the ions have entered. The depth at which the damaged region 404 is formed is equal to or greater than 10 nm and equal to or less than 500 nm, and preferably equal to or greater than 50 nm and equal to or less than 200 nm.

For example, when hydrogen ($H_2$) is used for a source gas and ions are introduced by an ion doping apparatus, plasma containing $H^+$, $H_2^+$, and $H_3^+$ can be produced by exciting a hydrogen gas. The proportion of ion species produced from the source gas can be changed by adjusting a plasma excitation method, pressure in an atmosphere for generating plasma, the supply amount of source gas, or the like.

$H_3^+$ has a larger number of hydrogen atoms than other hydrogen ion species ($H^+$ and $H_2^+$) and thus has large mass. Accordingly, when the ions are accelerated with the same energy, $H_3^+$ is introduced in a shallower region of the single crystal semiconductor substrate 401 as compared to $H^+$ and $H_2^+$. By increasing the proportion of $H_3^+$ included in the ion beams 403, the average depth at which the hydrogen ions have entered less varies; thus, in the single crystal semiconductor substrate 401, the hydrogen concentration profile in the depth direction becomes steeper and the peak position of the profile can shift to a shallow region. Accordingly, when an ion doping method is used, $H_3^+$ is contained at 50% or more, and preferably 80% or more of the total amount of $H^+$, $H_2^+$, and $H_3^+$ in the ion beams 403.

When ions are introduced using the hydrogen gas by an ion doping method, the acceleration voltage can be set in the range of 10 kV to 200 kV, and the dose can be set in the range of $1 \times 10^{16}$ ions/cm$^2$ to $6 \times 10^{16}$ ions/cm$^2$. By introducing the hydrogen ions under this condition, the damaged region 404 can be formed at a depth of 50 nm to 500 nm in the single crystal semiconductor substrate 401, though depending on the ion species and its proportion in the ion beams 403.

Next, an insulating film 405 is formed over the insulating film 402 (see FIG. 15A-3). The insulating film 405 functions as a layer (a bonding layer) which is attached to a supporting substrate.

As the insulating film 405, a silicon nitride film (SiNx), a silicon nitride oxide film (SiNxOy where x>y), or a silicon oxynitride film (SiOxNy where x>y) can be formed. It is preferable that the silicon nitride film or the silicon nitride oxide film be formed as the insulating film 405 since the insulating film 405 can function as a barrier layer for preventing impurities such as mobile ions and moisture included in the supporting substrate from diffusing into a single crystal semiconductor layer.

Further, since hydrogen bond largely contributes to bonding between the insulating film 405 and the supporting substrate, the insulating film 405 is formed so as to contain hydrogen. By using a silicon nitride film or a silicon nitride oxide film which contains hydrogen as the insulating film 405, strong bonding between the insulating film 405 and the supporting substrate made of glass or the like can be formed by hydrogen bonding with Si—H, Si—OH, N—H, and N—OH as bonding species. As a method for forming the insulating film 405 containing hydrogen, a plasma CVD method is used. The substrate temperature in film formation is equal to or more than room temperature and equal to or less than 350° C., and preferably equal to or more than room temperature equal to or less than 300° C., and a source gas containing hydrogen is used. By lowering the substrate temperature in film formation, surface roughness of the insulating film 405 to be formed can be reduced. This is because etching reaction by hydrogen radical or the like in a deposition surface of a film becomes excessive as the substrate temperature in film formation is increased, whereby surface roughness is caused.

More specifically, it is preferable that a silicon nitride film or a silicon nitride oxide film be formed using a source gas which contains at least a silane gas, an ammonia gas, and a hydrogen gas by a plasma CVD method. When the silicon nitride oxide film is formed, a nitrogen oxide gas may be added to the source gas. By using an ammonia gas and a hydrogen gas, the insulating film 405 containing hydrogen can be formed. Moreover, by lowering the substrate temperature in film formation, dehydrogenation reaction in film formation is suppressed, and the amount of hydrogen contained in the insulating film 405 can be increased. Accordingly, strong bonding between the insulating film 405 and the supporting substrate can be realized.

Figure 15B:

Next, a supporting substrate 400 is prepared (see FIG. 15B). The supporting substrate 400 is a light-transmitting substrate. Specific examples of a substrate which can be used as the supporting substrate 400 include glass substrates used for the electronics industry, such as substrates formed of aluminosilicate glass, aluminoborosilicate glass, or barium borosilicate glass; and a plastic substrate with a silicon oxide film or a silicon oxynitride film formed on its surface.

When a glass substrate is used as the supporting substrate 400, a large-sized mother glass substrate called the sixth generation (1500 mm×1850 mm), the seventh generation (1870 mm×2200 mm), or the eighth generation (2200 mm×2400 mm) can be used, for example.

Figure 15C:
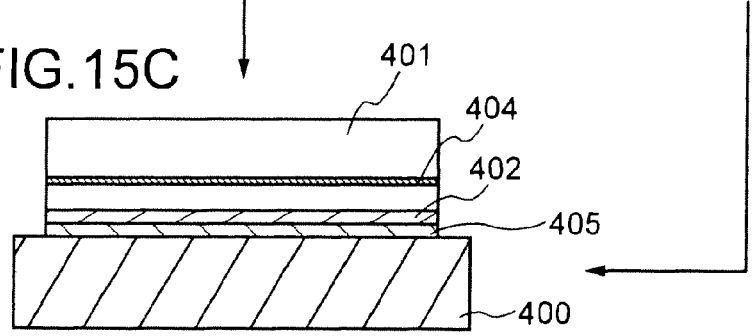

Next, the single crystal semiconductor substrate 401 and the supporting substrate 400 are bonded to each other (see FIG. 15C). The insulating film 405 formed over the surface of the single crystal semiconductor substrate 401 and a surface of the supporting substrate 400 are disposed in contact with each other, whereby bonding is formed. The bonding is formed by Van der Waals forces. By pressure bonding of the supporting substrate 400 and the single crystal semiconductor substrate 401, strong bonding can be formed by hydrogen bonding with Si—H, Si—OH, N—H, and N—OH as bonding species.

Before the single crystal semiconductor substrate 401 and the supporting substrate 400 are bonded to each other, megasonic cleaning is preferably performed on a bonding surface. More preferably, cleaning of the bonding surface is performed by both megasonic cleaning and ozone water cleaning. This is because by the cleaning treatment, dust such as an organic substance on the bonding surface is removed, and the bonding surface can be hydrophilic.

After the supporting substrate 400 and the insulating film 405 are bonded to each other, heat treatment of 400° C. or less may be performed. By performing the heat treatment, the bonding strength of the supporting substrate 400 and the single crystal semiconductor substrate 401 is increased.

Further, pressure treatment is preferably performed before or at the same time as the heat treatment. The pressure treatment is performed so that pressure is applied in a direction perpendicular to the bonding surface. By performing the pressure treatment, even when the surface of the supporting substrate 400 or the surface of the insulating film 405 has unevenness, the unevenness is absorbed by the insulating film 405 with low density, and bonding defects of the single crystal semiconductor substrate 401 and the supporting substrate 400 can be effectively reduced. Note that the temperature of the heat treatment is equal to or less than the allowable temperature limit of the supporting substrate 400, and for example, the pressure treatment is performed in the range of 200° C. to 600° C.

Figure 15D:
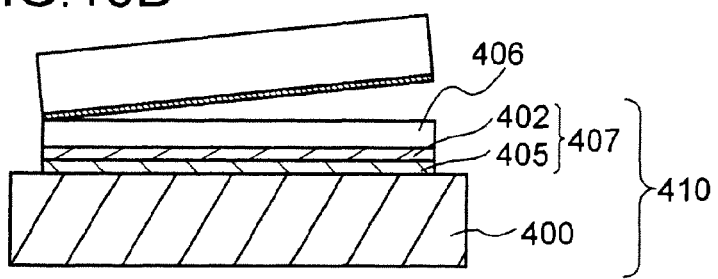

Next, heat treatment is performed, and part of the single crystal semiconductor substrate 401 is separated from the supporting substrate 400 using the damaged region 404 as a separation plane (see FIG. 15D). The temperature of the heat treatment is equal to or more than 400° C. and equal to or less than the strain point of the supporting substrate 400. When a device capable of performing rapid heating, such as an RTA (rapid thermal anneal) device, is used for the heat treatment, the heat treatment can be performed at a temperature higher than the strain point of the supporting substrate 400.

By the heat treatment, microvoids of the damaged region 404 change in volume, and a crack is generated in the damaged region 404. That is, the single crystal semiconductor substrate 401 is cleaved along the damaged region 404. Accordingly, a single crystal semiconductor layer 406 which has the same crystallinity as the single crystal semiconductor substrate 401 is formed over the supporting substrate 400.

Through the above steps, a semiconductor substrate 410 in which the single crystal semiconductor layer 406 is provided over the supporting substrate 400 with the insulating films 402 and 405 therebetween is formed. The insulating films 402 and 405 serve as a buffer layer 407.

After the single crystal semiconductor substrate 401 is cleaved, laser irradiation treatment in which the single crystal semiconductor layer 406 is irradiated with laser light is preferably formed. This is because when the single crystal semiconductor layer 406 is melted by laser light irradiation, the crystallinity of the single crystal semiconductor layer 406 can be recovered, and flatness of a top surface of the single crystal semiconductor layer 406 can be improved.

The method for manufacturing a semiconductor substrate is not limited to the above steps. For example, the damaged region 404 may be formed in a region at a predetermined depth from the surface of the single crystal semiconductor substrate 401 by performing ion introduction through the insulating films 402 and 405 after the formation of the insulating film 405, instead of performing ion introduction before the formation of the insulating film 405.

In another method for manufacturing a semiconductor substrate, an insulating film is formed on the supporting substrate 400 side, and this insulating film and the insulating film 405 are bonded to each other, whereby a semiconductor substrate having the same stacked-layer structure as the semiconductor substrate 33 in FIG. 2C can be formed.

Alternatively, in another method for manufacturing a semiconductor substrate, after the damaged region 404 is formed, the insulating film 402 is removed so that a surface of the single crystal semiconductor substrate 401 is exposed. Then, an insulating film is formed on the supporting substrate 400 side, and this insulating film and the single crystal semiconductor substrate 401 are bonded to each other, whereby a semiconductor substrate having the same stacked-layer structure as the semiconductor substrate 32 in FIG. 2B can be formed.

Embodiment Mode 7

In this embodiment mode, a method for manufacturing an input device provided with a display portion including a liquid crystal element by using a semiconductor substrate including a single crystal semiconductor layer is described.

This embodiment mode describes a method for manufacturing a panel in which a display portion including the pixel circuit 25 and the sensor circuit 26 in FIGS. 6A and 6B, the pixel driver circuit 23, and the sensor driver circuit 24 are formed over the same semiconductor substrate.

Figure 16:
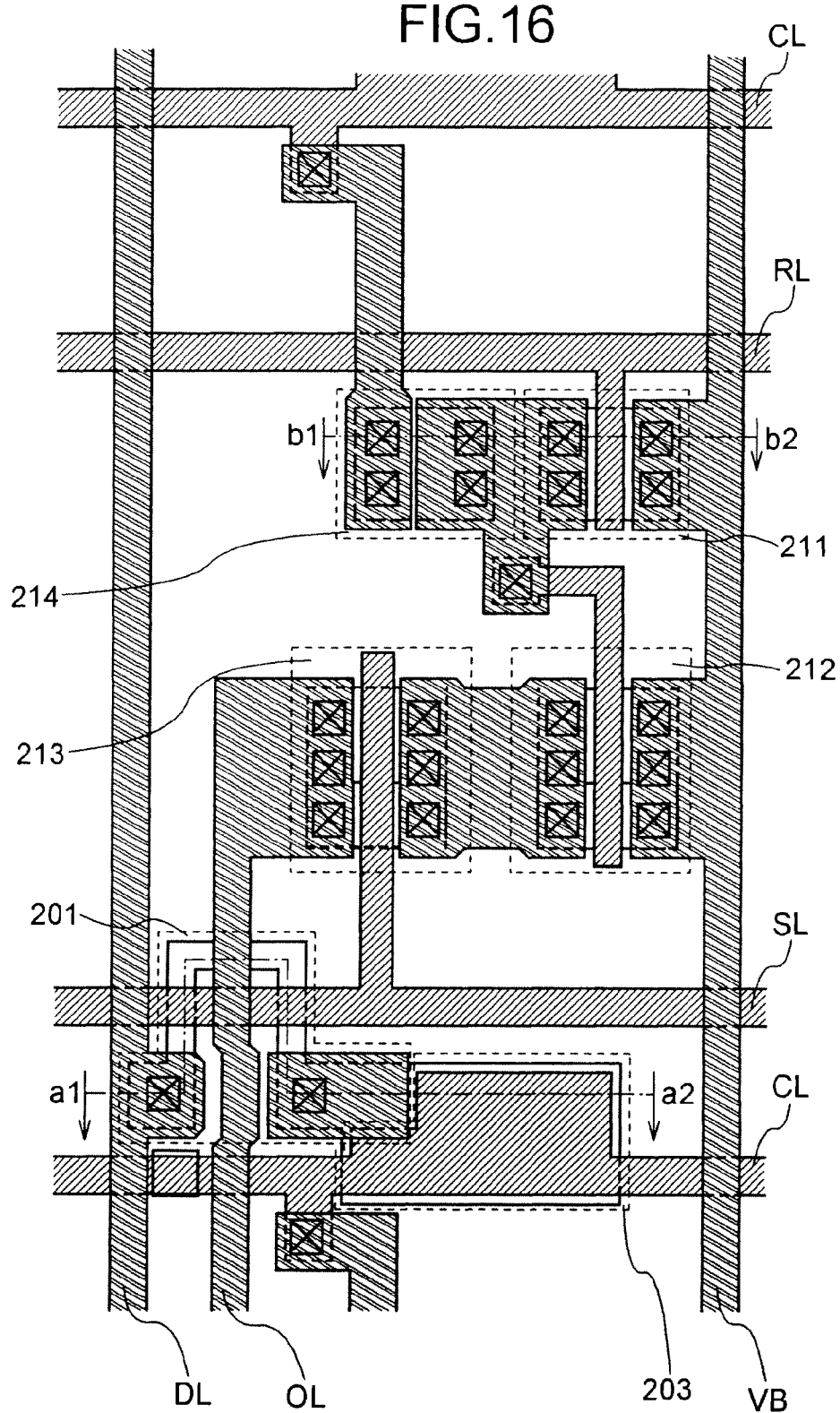
FIG. 16 is a layout diagram illustrating a structure of a pixel.
Figure 17:
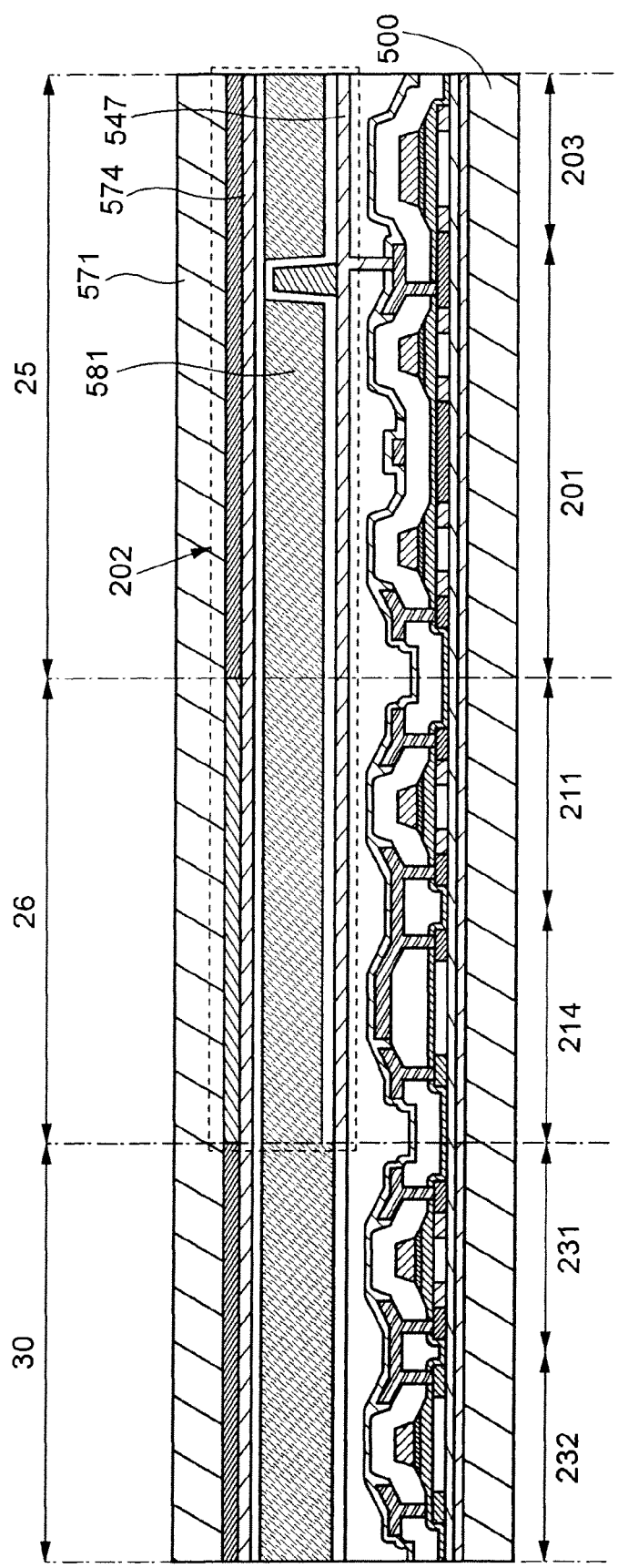
FIG. 17 is a cross-sectional view illustrating a structure of an input device.

FIG. 16 is a layout diagram illustrating a structure of a pixel. FIG. 16 illustrates a layout of a pixel circuit and a sensor circuit in a pixel, which are formed over a semiconductor substrate. FIG. 17 is a cross-sectional view illustrating a structure of an input device.

In an input device of this embodiment mode, transistors of the display portion 11, the pixel driver circuit 23, and the sensor driver circuit 24 are formed using a single crystal semiconductor layer of a semiconductor substrate. Note that FIG. 17 illustrates a main part of the input device. The switching transistor 201, the liquid crystal element 202, and the storage capacitor 203 are shown as the pixel circuit 25. The reset transistor 211 and the photodiode 214 are shown as the sensor circuit 26. In this embodiment mode, an n-channel transistor (hereinafter referred to as an n-type transistor) is used as the switching transistor 201 and the reset transistor 211.

Further, as the pixel driver circuit 23 and the sensor driver circuit 24 (here, these circuits are collectively referred to as a driver circuit 30), an inverter circuit including an n-channel transistor 231 and a p-channel transistor (hereinafter referred to as a p-type transistor) 232 is illustrated.

FIG. 17 illustrates a cross-sectional view of the pixel circuit 25 along the line a1-a2 in FIG. 16 and a cross-sectional view of the sensor circuit 26 along the line b1-b2 in FIG. 16.

Hereinafter, a method for manufacturing an input device is described with reference to FIGS. 18A to 18D, FIGS. 19A to 19C, and FIGS. 20A to 20C. FIGS. 18A to 18D, FIGS. 19A to 19C, and FIGS. 20A to 20C are cross-sectional views illustrating a method for manufacturing an input device and illustrate the elements in a similar manner to FIG. 17.

First, as illustrated in FIG. 18A, a semiconductor substrate is prepared. In this embodiment mode, the semiconductor substrate 410 in FIG. 15D is used. That is, a light-transmitting substrate 500 corresponds to the supporting substrate 400. An insulating film 501 corresponds to the insulating film 405 functioning as a barrier layer. An insulating film 502 corresponds to the insulating film 402. A single crystal semiconductor layer 503 corresponds to the single crystal semiconductor layer 406.

Note that it is preferable to add a p-type impurity element (an impurity element serving as an acceptor) such as boron, aluminum, or gallium or an n-type impurity element (an impurity element serving as a donor) such as phosphorus or arsenic to the single crystal semiconductor layer 503 in accordance with formation regions of the n-type transistor and the p-type transistor.

Next, as illustrated in FIG. 18B, the single crystal semiconductor layer 503 is etched, so that single crystal semiconductor layers 505 to 509 which are divided into island shapes in accordance with arrangement of semiconductor elements are formed.

Then, as illustrated in FIG. 18C, an insulating film 510 is formed to cover the single crystal semiconductor layers 505 to 509. The insulating film 510 serves as a gate insulating film of the transistor and a dielectric of the capacitor. Next, a conductive film forming an electrode and a wiring is formed over the insulating film 510. In this embodiment mode, a conductive film having a two-layer structure of a conductive film 511 and a conductive film 512 is formed.

The insulating film 510 is formed with a single-layer structure or a stacked-layer structure using an insulating layer such as a silicon oxide layer, a silicon oxynitride layer, a silicon nitride layer, or a silicon nitride oxide layer by a CVD method, a sputtering method, an ALE method, or the like.

Note that since the insulating film 510 forms an interface with the single crystal semiconductor layers 505 to 509, a layer in the insulating film 510, which is in contact with the single crystal semiconductor layers 505 to 509, is preferably formed using a silicon oxide layer or a silicon oxynitride layer. This is because when a film containing more nitrogen than oxide, such as a silicon nitride layer or a silicon nitride oxide layer, is formed, a trap level might be formed so that interface characteristics become a problem.

The conductive films 511 and 512 which form an electrode and a wiring can be formed using a metal film, an alloy film, or a metal compound film. For example, a metal film formed of tantalum, tantalum nitride, tungsten, titanium, molybdenum, aluminum, copper, chromium, niobium, or the like; a film formed of an alloy of the above metal elements; a metal compound film of the above metal element; or the like can be employed. These films can be formed by a CVD method or a sputtering method.

Examples of a combination of the conductive films 511 and 512 include a tantalum nitride film and a tungsten film, a tungsten nitride film and a tungsten film, and a molybdenum nitride film and a molybdenum film. Note that a stacked-layer film of a tantalum nitride film and a tungsten film is preferable because etching selectivity between the films is high. Here, a tantalum nitride film with a thickness of 20 nm to 100 nm is formed as the conductive film 511, and a tungsten film with a thickness of 100 nm to 400 nm is formed as the conductive film 512. Note that the conductive film forming an electrode, a wiring, or the like may be a single layer or a stacked layer of three films or more. When a three-layer structure is employed, a stacked-layer structure of a molybdenum film, an aluminum film, and a molybdenum film is preferably used.

Next, a resist mask is selectively formed over the conductive film 512. Then, by performing etching treatment twice, conductive films 515 to 518 having a two-layer structure are formed (see FIG. 18D). The conductive film 515 is a capacitor line CL. The conductive film 516 is a scan line SL. The conductive film 517 is a reset scan line RL. The conductive film 518 is an output wiring of the CMOS inverter circuit.

First, by etching the conductive films 511 and 512, stacked layers of the conductive films 511 and 512 having a tapered shape are formed over the single crystal semiconductor layers 505 and 507 to 509. By this etching, lower conductive films 515a to 518a in the conductive films 515 to 518 are formed. Next, only the conductive film 512 is etched so as to have a narrower width than the conductive film 511 while the resist mask remains over the conductive film 512, whereby conductive films 515b to 518b are formed. After the conductive films 515 to 518 are formed, the resist mask is removed.

The etching treatment for forming the conductive films 515 to 518 can be selected as appropriate. In order to increase etching speed, a dry etching apparatus using a high-density plasma source such as an ECR (electron cyclotron resonance) method or an ICP (inductively coupled plasma) method is preferably used.

Next, in order to form n-type high-resistance impurity regions 521 in the single crystal semiconductor layers 505, 507, and 508, a donor impurity such as phosphorus or arsenic is added by an ion doping method or an ion implantation method. In this embodiment mode, resist masks 520 are formed so that the donor impurity is not added to the single crystal semiconductor layers 506 and 509.

The donor impurity is added using the upper conductive films 515b to 518b in the conductive films 515 to 518 as masks. That is, the donor impurity is added so as to pass through the lower conductive films 515a to 518a. Accordingly, as illustrated in FIG. 19A, the n-type high-resistance impurity regions 521 are formed in the single crystal semiconductor layers 505, 507, and 508 in a self-aligned manner.

For example, when phosphorus is added, the n-type high-resistance impurity regions 521 contain phosphorus at a concentration of approximately $1\times10^{17}$ atoms/cm$^3$ to $5\times10^{18}$ atoms/cm$^3$ in order to form high-resistance regions of the n-type transistors (201, 211, and 231). After the step for adding the donor impurity element is finished, the resist masks 520 are removed.

Next, in order to form a source region and a drain region of the n-type transistors (201, 211, and 231) and an n-type impurity region of the photodiode, resist masks 522 which cover the single crystal semiconductor layer 509 and part of the single crystal semiconductor layers 506 to 508 are formed. Then, a donor impurity element is added to the single crystal semiconductor layers 506 to 508 using the resist masks 522 as masks by an ion doping method or an ion implantation method, whereby n-type low-resistance impurity regions 523 are formed (see FIG. 19B).

Here, phosphorus is added to the single crystal semiconductor layers 506 to 508 at a concentration of approximately $5\times10^{19}$ atoms/cm$^3$ to $5\times10^{20}$ atoms/cm$^3$. The n-type low-resistance impurity region 523 functions as the source region or the drain region of the n-type transistor.

Further, in the single crystal semiconductor layers 505, 507, and 508, regions to which the donor impurity element is not added serve as channel formation regions 524 to 528. Note that in the storage capacitor 203, the insulating film 510 is a dielectric, and the conductive film 515 and the channel formation region 526 serve as a pair of electrodes. Moreover, the switching transistor 201 and the storage capacitor 203 are electrically connected through one of the n-type low-resistance impurity regions 523 formed in the single crystal semiconductor layer 505.

Next, after the resist masks 522 are removed, in order to form a p-type impurity region of the photodiode 214 and a source region and a drain region of the p-type transistor, resist masks 530 which cover the single crystal semiconductor layers 505, 507, and 508 and part of the single crystal semiconductor layers 506 and 509 are formed. Then, an acceptor impurity element is added to the single crystal semiconductor layers 506 and 509 using the resist masks 530 as masks by an ion doping method or an ion implantation method, whereby p-type low-resistance impurity regions 531 are formed (see FIG. 19C).

As the acceptor impurity element, boron, aluminum, gallium, or the like is used. Here, boron is added so that boron concentration in the p-type low-resistance impurity region 531 is approximately $1\times10^{20}$ atoms/cm$^3$ to $5\times10^{21}$ atoms/cm$^3$.

In the single crystal semiconductor layer 506, a region 533 to which neither the donor impurity element nor the acceptor impurity region is added in the formation steps of the impurity regions 521, 523, and 531 (hereinafter the region 533 is referred to as a non-doped region 533) functions as an i-type region of a PIN junction. That is, in the single crystal semiconductor layer 506, the PIN junction is formed using the p-type low-resistance impurity region 531, the non-doped region 533, and the n-type low-resistance impurity region 523 and functions as a photoelectric conversion layer.

Moreover, in the single crystal semiconductor layer 509, a region to which neither the donor impurity element nor the acceptor impurity region is added serves as a channel formation region 532.

After the resist masks 530 are removed, heat treatment at a temperature equal to or higher than 500° C. and equal to or less than the strain point of the substrate 500 is performed to activate the donor impurity element and the acceptor impurity element added to the single crystal semiconductor layers 505 to 509.

Next, an insulating film 535 is formed over the entire surface of the substrate 500 (see FIG. 20A). The insulating film 535 may be a single layer formed of an inorganic material or an organic material, or a stacked layer. For example, as a film forming the insulating film 535, a silicon oxide film, a silicon oxynitride film, a silicon nitride film, a silicon nitride oxide film, or the like can be formed by a CVD method or a sputtering method. Moreover, a polyimide film, a polyamide film, a polyvinylphenol film, a benzocyclobutene film, an acrylic film, an epoxy film, a film formed of a siloxane material such as a siloxane resin, or an oxazole resin film can be formed by an application method such as a spin coating method.

For example, the insulating film 535 has a two-layer structure, a silicon nitride oxide film with a thickness of 100 nm is formed as a first layer, and a silicon oxynitride film with a thickness of 900 nm is formed as a second layer.

Then, after contact holes are formed in the insulating film 535, a conductive film having a single-layer structure or a stacked-layer structure is formed. As a film forming the conductive film, a metal film formed of aluminum, tungsten, titanium, tantalum, molybdenum, nickel, neodymium, or the like; an alloy film containing the above metal elements; or a metal compound film of the above metal element can be used. For example, an aluminum alloy film containing titanium or an aluminum alloy film containing neodymium can be used. When the conductive film has a three-layer structure, a film in which an aluminum film or an aluminum alloy film as described above is interposed between titanium films can be formed, for example.

Etching treatment is performed on the conductive film, so that conductive films 536 to 544 are formed (see FIG. 20A). The conductive film 536 is a data line DL. The conductive film 537 is an output line OL for sensors. The conductive film 538 is an electrode for electrically connecting the switching transistor 201 and the storage capacitor 203 to the liquid crystal element 202.

Moreover, the conductive film 539 is an electrode for electrically connecting the photodiode 214 to the capacitor line CL. The conductive film 540 is an electrode for electrically connecting the photodiode 214 and the reset transistor 211 to each other, and functions as a light shielding film of the photodiode 214. The conductive film 541 is a power supply line VB for sensors.

The conductive film 542 is a source electrode of the n-type transistor 231. The conductive film 543 is a source electrode of the p-type transistor 232. The conductive film 544 is an output wiring of the CMOS inverter circuit.

Next, a passivation film 545 and an insulating film 546 are formed over the entire surface of the substrate 500. Here, as the passivation film 545, a silicon nitride film with a thickness of 50 nm to 100 nm is formed by a plasma CVD method. The insulating film 546 can be formed in a similar manner to the insulating film 535 (see FIG. 20B).

Then, after a contact hole which reaches the conductive film 538 is formed in the passivation film 545 and the insulating film 546, a light-transmitting conductive film is formed over the insulating film 546. The conductive film is etched, and a pixel electrode 547 is formed (see FIG. 20B).

Through the above steps, the pixel circuit 25, the sensor circuit 26, and the driver circuit 30 are formed using the semiconductor substrate. Although not shown, the substrate 500 is also provided with an external connection terminal.

The pixel electrode 547 is a light-transmitting electrode through which light from the backlight unit 56 passes. Accordingly, as a conductive film forming the pixel electrode 547, an indium tin oxide film formed by mixing indium oxide with tin oxide, an indium tin silicon oxide film formed by mixing indium tin oxide with silicon oxide, an indium zinc oxide film formed by mixing indium oxide with zinc oxide, a zinc oxide film, a tin oxide film, or the like can be used.

Then, a columnar spacer 548 is formed in the pixel. Next, an alignment film 549 is formed over the entire surface of the substrate 500. The spacer 548 can be formed using a photosensitive resin film. The alignment film 549 is formed as necessary. Further, rubbing treatment is performed on the alignment film 549 as necessary.

Next, a method for manufacturing an opposite substrate is described with reference to FIG. 20C. A color filter 572 and a BM (black matrix) 573 are formed over a substrate 571 made of glass. In the pixel circuit 25, the switching transistor 201 and the storage capacitor 203 are shielded from light by the BM 573. Moreover, the driver circuit 30 is also shielded from light by the BM 573.

An opposite electrode 574 made of a light-transmitting conductive film is formed over the color filter 572 and the BM 573. The conductive film forming the opposite electrode 574 can be formed in a similar manner to the pixel electrode 547. Then, an alignment film 575 is formed over the entire surface of the substrate 571. The alignment film 575 is formed as necessary. Further, rubbing treatment is performed on the alignment film 575 as necessary.

Next, a liquid crystal layer 581 is formed between the substrate 500 in FIG. 20B and the substrate 571 in FIG. 20C, whereby a liquid crystal panel is completed (see FIG. 17). The liquid crystal element 202 includes the pixel electrode 547, the opposite electrode 574, and the liquid crystal layer 581.

There are roughly two methods for forming the liquid crystal layer 581. In one method, an uncured sealing material is formed over the substrate 500 or the substrate 571 except for an inlet, the substrate 500 and the substrate 571 are attached to each other, and the sealing material is cured. Then, a liquid crystal material is injected from the inlet, and after that, the inlet is sealed. In another method, an uncured sealing material is formed over the substrate 500 or the substrate 571 without the formation of an inlet. Then, a liquid crystal material is dropped on a surface of the substrate over which the sealing material is formed and thereafter, the other substrate is attached and the sealing material is cured.

Through the above steps, an input device including a liquid crystal panel according to this embodiment mode is manufactured. Note that a backlight unit is provided on the substrate 571 side, and illumination light from the backlight unit enters the substrate 571 and is extracted from the substrate 500 to the outside. The substrate 500 side serves as a screen of the display portion 11. By touching the substrate 500 side with a finger or the like, information can be input in the display portion 11.

Note that a circuit other than the driver circuit 30 can be formed over the substrate 500. Since an element can be formed using the single crystal semiconductor layer 503, a CPU forming an arithmetic circuit or an image processing circuit forming a display control circuit, for example, can be formed over the substrate 500.

Embodiment Mode 8

In this embodiment mode, a method for manufacturing an input device provided with a display portion including a light-emitting element by using a semiconductor substrate including a single crystal semiconductor layer is described.

This embodiment mode describes a method for manufacturing a panel in which a display portion including the pixel circuit 27 and the sensor circuit 28 in FIGS. 8A and 8B, the pixel driver circuit 23, and the sensor driver circuit 24 are formed over the same semiconductor substrate.

Figure 21:
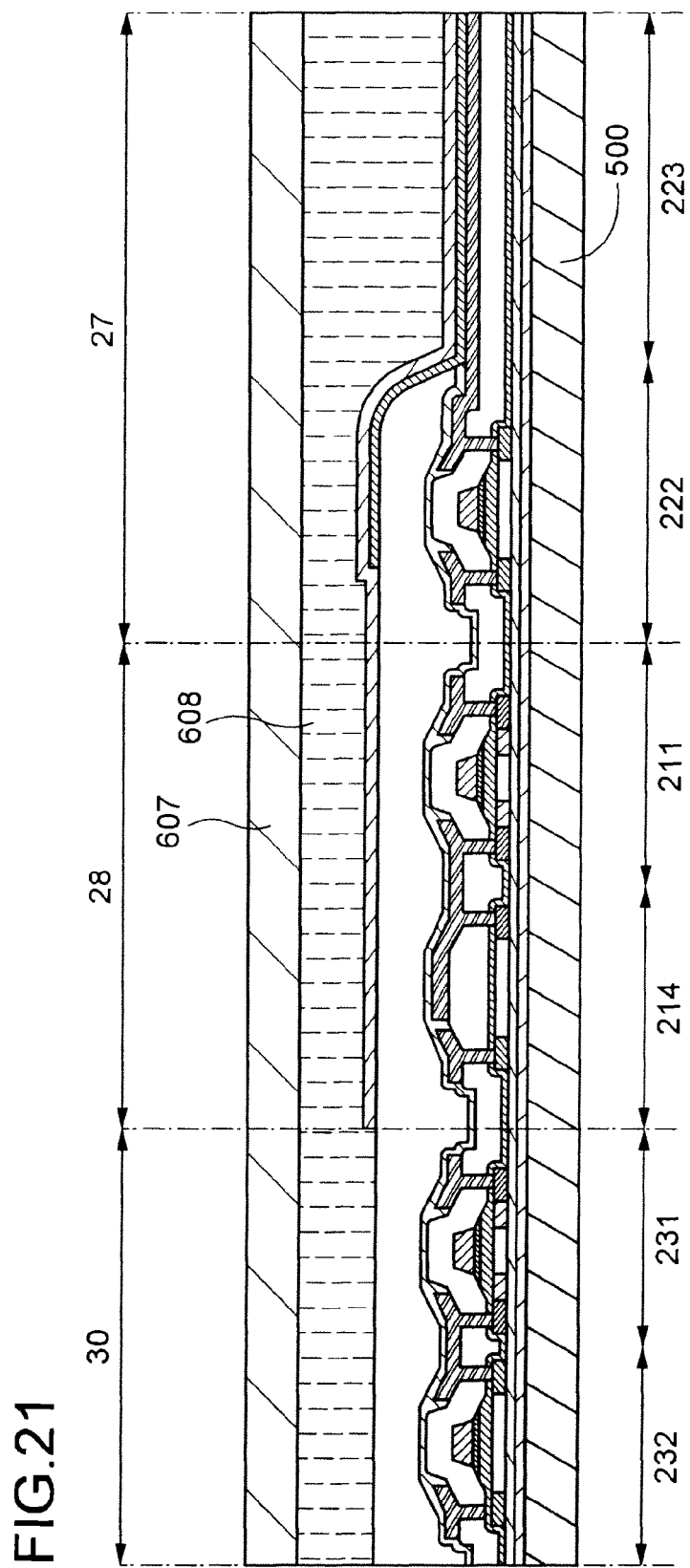
FIG. 21 is a cross-sectional view illustrating a structure of an input device.

FIG. 21 is a cross-sectional view illustrating a structure of an input device.

In an input device of this embodiment mode, transistors of the display portion 11, the pixel driver circuit 23, and the sensor driver circuit 24 are formed over a semiconductor substrate. Note that FIG. 21 illustrates a main part of the input device. The display control transistor 222 and the light-emitting element 223 are shown as the pixel circuit 27. The reset transistor 211 and the photodiode 214 are shown as the sensor circuit 28. In this embodiment mode, an n-type transistor is used as the display control transistor 222 and the reset transistor 211.

Further, as the driver circuit 30, an inverter circuit including the n-channel transistor 231 and the p-channel transistor 232 is illustrated.

Hereinafter, a method for manufacturing an input device is described with reference to FIGS. 22A and 22B. FIGS. 22A and 22B are cross-sectional views illustrating a method for manufacturing an input device and illustrate the elements in a similar manner to FIG. 21.

First, the transistors, the capacitor, and the photodiode in the display portion and the transistor, the capacitor, and the like in the driver circuit 30 are formed through the steps illustrated in FIGS. 18A to 18D, FIGS. 19A to 19C, and FIGS. 20A and 20B. A state at that time is illustrated in FIG. 22A. Note that in the display control transistor 222, a conductive film 601 formed over the insulating film 535 is a power supply line VL for light-emitting elements. A conductive film 602 is a pixel electrode forming the light-emitting element 223, and functions as a reflective electrode.

Next, an opening portion which exposes a surface of the conductive film 602 is formed in the passivation film 545. An insulating film 603 which covers an end portion of the conductive film 602 is formed over the passivation film 545 (see FIG. 22B).

The insulating film 603 is preferably formed using a photosensitive resin. Examples of the photosensitive resin includes organic materials such as polyimide, polyamide, polyvinylphenol, benzocyclobutene, acrylic, and epoxy. The insulating film 603 functions as a partition wall film for dividing an EL layer of the light-emitting element 223 among elements.

Next, an EL layer 604 and an opposite electrode 605 are formed over the conductive film 602. For the EL layer 604, at least a light-emitting layer is formed. Other than the light-emitting layer, a hole injection layer, a hole transport layer, an electron transport layer, or an electron injection layer may be formed as appropriate. A film containing an organic compound can be formed by an application method such as an inkjet method or an evaporation method.

The opposite electrode 605 is a light-transmitting electrode. As a conductive film forming the opposite electrode 605, an indium tin oxide film formed by mixing indium oxide with tin oxide, an indium tin silicon oxide film formed by mixing indium tin oxide with silicon oxide, an indium zinc oxide film formed by mixing indium oxide with zinc oxide, a zinc oxide film, a tin oxide film, or the like can be used.

Through the above steps, the light-emitting element 223 in which the EL layer 604 including at least the light-emitting layer is interposed between the conductive film 602 and the opposite electrode 605 is formed (see FIG. 22B).

Next, a substrate 607 is fixed to a top surface of the substrate 500 (see FIG. 21). In this embodiment mode, a resin 608 which is a solid is provided between the substrate 500 and the substrate 607. Instead of the resin 608, an inert gas may be sealed between the substrate 500 and the substrate 607 with a sealing material. Note that a protection film made of a silicon nitride film or the like may be formed so as to cover the opposite electrode 605.

Through the above steps, an input device including an EL panel according to this embodiment mode is manufactured. Note that in this embodiment mode, light of the light-emitting element 223 is reflected by the conductive film 602 and extracted from the substrate 607 to the outside. The substrate 607 side serves as a screen of the display portion 11. By touching the substrate 607 side with a finger or the like, information can be input in the display portion 11.

This application is based on Japanese Patent Application serial No. 2007-312533 filed with Japan Patent Office on Dec. 3, 2007, the entire contents of which are hereby incorporated by reference.

What is claimed is:

1. A method for manufacturing a display device including a display portion including a plurality of pixels; a pixel circuit provided in each of the plurality of pixels and including a display element and a first transistor; a sensor circuit provided in all or part of the plurality of pixels and including an optical sensor and a second transistor; a pixel driver circuit electrically connected to the pixel circuit and including a third transistor; and a sensor driver circuit electrically connected to the sensor circuit and including a fourth transistor, comprising the steps of:

preparing a single crystal semiconductor substrate and a supporting substrate;

forming a damaged region in a region at a predetermined depth from a surface of the single crystal semiconductor substrate by adding ions to the single crystal semiconductor substrate;

forming a buffer layer over at least one of the supporting substrate and the single crystal semiconductor substrate;

bonding the single crystal semiconductor substrate to the supporting substrate with the buffer layer interposed therebetween;

forming the supporting substrate to which a single crystal semiconductor layer separated from the single crystal semiconductor substrate is provided, by generating a crack in the damaged region by heating of the single crystal semiconductor substrate so that the single crystal semiconductor substrate is separated from the supporting substrate;

forming a plurality of single crystal semiconductor layers by dividing the single crystal semiconductor layer among elements; and forming the first transistor, the second transistor, the third transistor, the fourth transistor and a photoelectric conversion layer of the optical sensor using the divided single crystal semiconductor layer, wherein the ions include $H^+$, $H_2^+$ and $H_3^+$, and wherein $H_3^+$ is included in the ions at greater than or equal to 50%.

2. The method for manufacturing the display device according to claim 1, wherein the buffer layer comprises an insulating film including nitrogen.

3. The method for manufacturing the display device according to claim 1, wherein the ions are added to the single crystal semiconductor substrate through an insulating film formed on the single crystal semiconductor substrate.

4. The method for manufacturing the display device according to claim 1, wherein the display element is a liquid crystal element.

5. The method for manufacturing the display device according to claim 1, wherein the display element is a light-emitting element.

6. A method for manufacturing a display device including a display portion including a plurality of pixels; a pixel circuit provided in each of the plurality of pixels and including a display element and a first transistor; a sensor circuit provided in all or part of the plurality of pixels and including an optical sensor and a second transistor; a pixel driver circuit electrically connected to the pixel circuit and including a third transistor; and a sensor driver circuit electrically connected to the sensor circuit and including a fourth transistor, comprising the steps of:

preparing a single crystal semiconductor substrate and a supporting substrate;

forming a damaged region in a region at a predetermined depth from a surface of the single crystal semiconductor substrate by adding ions to the single crystal semiconductor substrate;

forming a buffer layer over at least one of the supporting substrate and the single crystal semiconductor substrate;

bonding the single crystal semiconductor substrate to the supporting substrate with the buffer layer interposed therebetween;

forming the supporting substrate to which a single crystal semiconductor layer separated from the single crystal semiconductor substrate is provided, by generating a crack in the damaged region by heating of the single crystal semiconductor substrate so that the single crystal semiconductor substrate is separated from the supporting substrate;

irradiating the single crystal semiconductor layer with a laser beam;

forming a plurality of single crystal semiconductor layers by dividing the single crystal semiconductor layer among elements; and forming the first transistor, the second transistor, the third transistor, the fourth transistor and a photoelectric conversion layer of the optical sensor using the divided single crystal semiconductor layer, wherein the ions include $H^+$, $H_2^+$ and $H_3^+$, and wherein $H_3^+$ is included in the ions at greater than or equal to 50%.

7. The method for manufacturing the display device according to claim 6, wherein the buffer layer comprises an insulating film including nitrogen.

8. The method for manufacturing the display device according to claim 6, wherein the ions are added to the single crystal semiconductor substrate through an insulating film formed on the single crystal semiconductor substrate.

9. The method for manufacturing the display device according to claim 6, wherein the display element is a liquid crystal element.

10. The method for manufacturing the display device according to claim 6, wherein the display element is a light-emitting element.

* * * * *